United States Patent
Du et al.

(10) Patent No.: US 12,217,688 B2
(45) Date of Patent: *Feb. 4, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Wei Zhang, Beijing (CN); Yu Zhang, Beijing (CN); Chi Yu, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/511,406

(22) Filed: Nov. 16, 2023

(65) Prior Publication Data
US 2024/0087528 A1    Mar. 14, 2024

Related U.S. Application Data

(63) Continuation of application No. 17/915,358, filed as application No. PCT/CN2021/124084 on Oct. 15, 2021, now Pat. No. 11,847,970.

(30) Foreign Application Priority Data
Nov. 27, 2020   (CN) .......................... 202011356237.5

(51) Int. Cl.
G09G 3/3233    (2016.01)
H10K 59/131    (2023.01)
H10K 59/35     (2023.01)

(52) U.S. Cl.
CPC ......... *G09G 3/3233* (2013.01); *H10K 59/131* (2023.02); *H10K 59/353* (2023.02);
(Continued)

(58) Field of Classification Search
CPC ... G09G 2300/0842; G09G 2300/0426; G09G 3/3233; G09G 2300/0819;
(Continued)

(56) References Cited

U.S. PATENT DOCUMENTS 9,858,853 B2    1/2018   Giannikouris et al.
10,825,396 B2   11/2020  Chen et al.
(Continued)

FOREIGN PATENT DOCUMENTS

CN    107591125 A    1/2018
CN    107886901 A    4/2018
(Continued)

OTHER PUBLICATIONS

Notice of Allowance dated Aug. 7, 2023 received in U.S. Appl. No. 17/915,358.
(Continued)

*Primary Examiner* — Muhammad N Edun
(74) *Attorney, Agent, or Firm* — Scully, Scott, Murphy & Presser, P.C.

(57) ABSTRACT

A display substrate and a display device are provided. The display substrate includes a first display region including first light emitting unit groups and first pixel circuit groups connected with the first light emitting unit groups, a second display region including second light emitting unit groups, second pixel circuit groups connected with the second light
(Continued)

emitting unit groups and third pixel circuit groups, and a third display region including third light emitting unit groups connected with the third pixel circuit groups. Each light emitting unit group includes light emitting units of different colors. The light emitting unit includes a main body electrode, an area of the main body electrode of at least one color light emitting unit in the third display region is greater than that of a main body electrode of the same color light emitting unit in the first display region.

20 Claims, 16 Drawing Sheets

(52) U.S. Cl.
CPC .............. *G09G 2300/0426* (2013.01); *G09G 2300/0819* (2013.01); *G09G 2300/0842* (2013.01); *G09G 2320/0233* (2013.01); *G09G 2320/0686* (2013.01)

(58) Field of Classification Search
CPC ..... G09G 2320/0233; G09G 2320/045; G09G 2320/0686; G09G 2300/0814; G09G 2300/0866; H10K 59/12; H10K 59/131; H10K 59/353; H10K 50/80; H10K 59/00; H10K 50/805
See application file for complete search history.

(56) References Cited

U.S. PATENT DOCUMENTS

| | | |
|---|---|---|
| 10,872,566 B2 | 12/2020 | Qu et al. |
| 11,217,159 B2 | 1/2022 | Zhang et al. |
| 11,374,084 B2 | 6/2022 | Wang |
| 11,574,968 B2 | 2/2023 | Fan |
| 11,600,230 B2 | 3/2023 | Wang et al. |
| 2017/0352330 A1 | 12/2017 | Ip et al. |
| 2019/0172392 A1 | 6/2019 | Qian et al. |
| 2019/0326366 A1 | 10/2019 | Fan et al. |
| 2020/0066809 A1 | 2/2020 | Liu |
| 2020/0227488 A1 | 7/2020 | Xin et al. |
| 2021/0013277 A1 | 1/2021 | Liu et al. |
| 2021/0066427 A1 | 3/2021 | Ma et al. |
| 2021/0358379 A1 | 11/2021 | Li et al. |
| 2022/0157898 A1 | 5/2022 | Lou et al. |
| 2022/0158059 A1 | 5/2022 | Jin et al. |
| 2022/0231093 A1 | 7/2022 | Zhang et al. |
| 2022/0310746 A1 | 9/2022 | Huang et al. |

FOREIGN PATENT DOCUMENTS

| | | |
|---|---|---|
| CN | 108039149 A | 5/2018 |
| CN | 108335668 A | 7/2018 |
| CN | 108717841 A | 10/2018 |
| CN | 110085646 A | 8/2019 |
| CN | 110379356 A | 10/2019 |
| CN | 110415650 A | 11/2019 |
| CN | 110490838 A | 11/2019 |
| CN | 110504289 A | 11/2019 |
| CN | 110599957 A | 12/2019 |
| CN | 110610680 A | 12/2019 |
| CN | 209947878 U | 1/2020 |
| CN | 110808009 A | 2/2020 |
| CN | 110874990 A | 3/2020 |
| CN | 110914891 A | 3/2020 |
| CN | 111192902 A | 5/2020 |
| CN | 111326560 A | 6/2020 |
| CN | 111668278 A | 9/2020 |
| CN | 111708199 A | 9/2020 |
| CN | 111834413 A | 10/2020 |
| CN | 111834538 A | 10/2020 |
| CN | 111969027 A | 11/2020 |
| JP | 2007047668 A | 2/2007 |

OTHER PUBLICATIONS

International Search Report and Written Opinion dated Dec. 16, 2021 received in International Application No. PCT/CN2021/124082.

International Search Report and Written Opinion dated Jan. 14, 2022 received in International Application No. PCT/CN2021/124084.

Office Action dated Feb. 11, 2023 received in Chinese Patent Application No. CN 202011356201.7.

DISPLAY SUBSTRATE AND DISPLAY DEVICE

CROSS-REFERENCE TO RELATED APPLICATION

This application is a continuation application of U.S. Ser. No. 17/915,358 filed on Sep. 28, 2022, which is a U.S. national phase entry of PCT International Application No. PCT/CN2021/124084 filed on Oct. 15, 2021, which claims priority to Chinese Patent Application No. 202011356237.5 filed on Nov. 27, 2020. The entire disclosure of U.S. Ser. No. 17/915,358, the entire disclosure of PCT International Application No. PCT/CN2021/124084 and the entire disclosure of Chinese Patent Application No. 202011356237.5 are hereby incorporated in their entirety by this reference as a part of the subject application.

TECHNICAL FIELD

The embodiments of the present disclosure relate to display substrate and a display device.

BACKGROUND

With people's constant pursuit of visual effect of display products, narrow frame or even full screen display has become a new trend in the development of organic light emitting diode (OLED) display products. With the screen ratio of many mobile phones gradually increasing steadily, full screen has become the current trend. A front camera is the key to design a full screen. In order to achieve a higher screen ratio, display products with screens such as bang screen, water drop screen and punch hole screen have appeared one after another. These full screen forms have increased the screen ratio by sacrificing the appearance of mobile phones. Therefore, the design that the camera is arranged under the screen can not only ensure the appearance of the mobile phone, but also increase the screen ratio. Under-screen camera refers to that the front camera is located under the screen but does not affect the display function of the screen. Upon the front camera being not used, the screen above the camera can still display images normally. From the appearance, the under-screen camera will not have any camera holes, which really achieves the full screen display effect.

SUMMARY

At least one embodiment of the present disclosure provides a display substrate and a display device.

At least one embodiment of the present disclosure provides a display substrate, which includes: a base substrate, including a first display region, a second display region and a third display region, wherein the first display region includes a plurality of first light emitting unit groups and a plurality of first pixel circuit groups respectively connected with the plurality of first light emitting unit groups, the second display region includes a plurality of second light emitting unit groups, a plurality of second pixel circuit groups and a plurality of third pixel circuit groups, the plurality of second light emitting unit groups are respectively connected with the plurality of second pixel circuit groups, the third display region includes a plurality of third light emitting unit groups, which are respectively connected with the plurality of third pixel circuit groups, and a density of the plurality of second light emitting unit groups and a density of the plurality of third light emitting unit groups are both smaller than a density of the plurality of first light emitting unit groups, each light emitting unit group includes a plurality of light emitting units, and each of the light emitting units includes a first electrode, a light emitting layer, and a second electrode which are sequentially arranged along a direction perpendicular to the base substrate, and the second electrode is on a side of the light emitting layer facing the base substrate. The second electrode of each of the light emitting units includes a main body electrode and a connection electrode, the connection electrode is configured to connect a pixel circuit, and each light emitting unit group located in display regions includes a plurality of light emitting units of different colors; among the light emitting units of a same color, an area of the main body electrode of at least one light emitting unit located in the third display region is greater than an area of at least one main body electrode located in the first display region.

For example, in an embodiment of the present disclosure, an area of an effective light emitting region of a light emitting unit of one color located in at least one of the third display region and the non-edge region of the second display region is greater than an area of a light emitting unit, with the same color as the light emitting unit of one color, located in the first display region.

For example, in an embodiment of the present disclosure, each pixel circuit group comprises a plurality of pixel circuits, and at least one of the second pixel circuit groups and the third pixel circuit groups comprises a plurality of pixel circuit pairs, and two pixel circuits included in each of the pixel circuit pairs are configured to be electrically connected with the second electrode of a same light emitting unit.

For example, in an embodiment of the present disclosure, each light emitting unit group comprises a first color light emitting unit, and an area ratio of the main body electrode of each first color light emitting unit located in at least one of the third display region and the non-edge region of the second display region to the main body electrode of each first color light emitting unit located in the first display region is in a range of 1.5 to 2.5.

For example, in an embodiment of the present disclosure, each light emitting unit group located in the display region further comprises a second color light emitting unit pair, the first color light emitting unit and the second color light emitting unit pair are arranged in a first direction, and two second color light emitting units included in the second color light emitting unit pair are arranged in a second direction, and the first direction and the second direction intersect with each other, an area ratio of the main body electrode of each second color light emitting unit pair located in at least one of the third display region and the non-edge region of the second display region to the main body electrode of each second color light emitting unit pair located in the first display region is in a range of 1.5 to 2.5.

For example, in an embodiment of the present disclosure, each light emitting unit group located in the display region further comprises a third color light emitting unit, the first color light emitting unit and the third color light emitting unit are arranged along the first direction, and an area ratio of the main body electrode of each third color light emitting unit located in at least one of the third display region and the non-edge region of the second display region to the main body electrode of each third color light emitting unit located in the first display region is in a range of 1.5 to 2.5.

For example, in an embodiment of the present disclosure, the main body electrode of each first color light emitting unit in a row of light emitting unit groups, adjacent to the first display region, in the second display region has substantially the same shape and the same area as each first color light emitting unit located in the first display region; the main body electrode of each second color light emitting unit pair in the row of light emitting unit groups, adjacent to the first display region, in the second display region has approximately the same area as the main body electrode of each second color light emitting unit pair located in the first display region; the main body electrode of each third color light emitting unit in the row of light emitting unit groups, adjacent to the first display region, in the second display region has substantially the same shape and the same area as each third color light emitting unit located in the first display region.

For example, in an embodiment of the present disclosure, shapes of main body electrodes of two second color sub-pixels included in the second color sub-pixel pair in the first display region are different from shapes of two main body electrodes of each second color light emitting unit pair of the light emitting unit group in the row, adjacent to the first display region, in the second display region.

For example, in an embodiment of the present disclosure, shapes of the main body electrodes of the two second color sub-pixels included in the second color sub-pixel pair of the first display region are both pentagons, and each of the pentagons comprises one first edge extending in the second direction, two second edges extending in the first direction, and two third edges connected with the two second edges, the two third edges intersect to form a sharp corner, and two sharp corners of the main body electrodes of the two second color sub-pixels are adjacent to each other, each main body electrode of each second color light emitting unit pair in the row of light emitting unit groups, adjacent to the first display region, in the second display region comprises one fourth edge extending in the second direction, two fifth edges extending in the first direction, two sixth edges connected with the two fifth edges and a seventh edge connecting the two sixth edges, and two seventh edges of the main body electrodes of the two second color sub-pixels are adjacent to each other.

For example, in an embodiment of the present disclosure, a length of the second edge is smaller than a length of the fifth edge.

For example, in an embodiment of the present disclosure, a central connection line of two main body electrodes of each second color light emitting unit pair in the row of light emitting unit groups, adjacent to the first display region, in the second display region is not parallel to a central connection line of two main body electrodes of each second color light emitting unit pair in the first display region.

For example, in an embodiment of the present disclosure, in a column of light emitting unit groups, adjacent to the first display region, in the second display region, the second color light emitting unit pair is located at a side of the first color light emitting unit and the third color light emitting unit close to the first display region; an area and a shape of the main body electrode of each second color light emitting unit pair in the column of light emitting unit groups, adjacent to the first display region, in the second display region are approximately the same as an area and a shape of the main body electrode of each second color light emitting unit pair located in the first display region.

For example, in an embodiment of the present disclosure, an area ratio of the main body electrode of each first color light emitting unit in the column of light emitting unit groups, adjacent to the first display region, in the second display region to the main body electrode of each first color light emitting unit located in the first display region is in a range of 1.5 to 2.5; an area ratio of the main body electrode of each third color light emitting unit in the column of light emitting unit groups, adjacent to the first display region, in the second display region to the main body electrode of each third color light emitting unit located in the first display region is in a range of 1.5-2.5.

For example, in an embodiment of the present disclosure, each pixel circuit group comprises a plurality of pixel circuits, the plurality of second pixel circuit groups comprise a plurality of first pixel circuit units, each first pixel circuit unit at least comprises a first pixel circuit and a second pixel circuit, and at least two pixel circuits in the first pixel circuit unit are configured to be electrically connected with the second electrode of a same light emitting unit, each of the plurality of pixel circuits comprises a data writing transistor, a driving transistor and a first reset transistor, a second electrode of the first reset transistor is connected with the second electrode of a corresponding light emitting unit, and a first electrode of the data writing transistor is connected with a second electrode of the driving transistor, the display substrate further comprises a plurality of first connection portions, a first end of each first connection portion of at least part of the first connection portions is connected with a second electrode of the data writing transistor of the first pixel circuit, and a second end of each first connection portion of the at least part of the first connection portions is connected with a second electrode of the data writing transistor of the second pixel circuit to connect at least two data writing transistors of the first pixel circuit unit with a same data line, at least portion of each first connection portion of the at least part of the first connection portions is located between the second electrode of the data writing transistor and the first electrode of the first reset transistor in the first pixel circuit.

For example, in an embodiment of the present disclosure, each of the pixel circuits further comprises a threshold compensation transistor, a first electrode of the threshold compensation transistor is connected with the first electrode of the driving transistor, a second electrode of the threshold compensation transistor is connected with a gate electrode of the driving transistor, and the first connection portion is located between the second electrode of the threshold compensation transistor and the first electrode of the first reset transistor in the first pixel circuit.

For example, in an embodiment of the present disclosure, the first display region comprises a plurality of first light emitting units and a plurality of first sub-pixel circuits; the plurality of first light emitting units comprise a first light emitting unit column and a second light emitting unit column which are arranged adjacently; each light emitting unit column is connected with a corresponding column of first sub-pixel circuits; the second display region comprises a plurality of second light emitting units and a plurality of second sub-pixel circuits; the plurality of second light emitting units comprise a third light emitting unit column and a fourth light emitting unit column which are arranged adjacently, and each light emitting unit column in the second display region is connected with a column of first sub-pixel circuit pairs, and each column of first sub-pixel circuit pairs comprise two adjacent columns of second sub-pixel circuits; and a plurality of first sub data lines, a plurality of second sub data lines, a plurality of third sub data lines and a plurality of fourth sub data lines on the base substrate, wherein each of the first sub data lines is connected with each first light emitting unit column, each of the second sub data lines is connected with each second light emitting unit column, each of the third sub data lines is connected with each third light emitting unit column, and each of the fourth sub data lines is connected with each fourth light emitting unit column. An arrangement direction of the first light emitting unit column and the second light emitting unit column is the same as an arrangement direction of the third light emitting unit column and the fourth light emitting unit column; one column of first sub-pixel circuits connected with the first light emitting unit column and one column of second sub-pixel circuits connected with the third light emitting unit column are located in a same column, and one first sub data line and one third sub data line are one continuous data line extending in the second direction; two columns of second sub-pixel circuits connected with the fourth light emitting unit column and one column of first sub-pixel circuits connected with the second light emitting unit column are located in different columns, and the second sub data line and the fourth sub data line are connected by a data line connection portion, and an extending direction of the data line connection portion intersects with an extending direction of the first sub data lines.

For example, in an embodiment of the present disclosure, each light emitting unit group located in the display region further comprises a second color light emitting unit pair, the first color light emitting unit and the second color light emitting unit pair are arranged in a first direction, and two second color light emitting units included in the second color light emitting unit pair are arranged in a second direction, and the first direction and the second direction intersect with each other, an area ratio of the main body electrode of each second color light emitting unit pair located in at least one of the third display region and the non-edge region of the second display region to the main body electrode of each second color light emitting unit pair located in the first display region is in a range of 1.5 to 2.5.

For example, in an embodiment of the present disclosure, each light emitting unit group located in the display region further comprises a third color light emitting unit, the first color light emitting unit and the third color light emitting unit are arranged along the first direction, and an area ratio of the main body electrode of each third color light emitting unit located in at least one of the third display region and the non-edge region of the second display region to the main body electrode of each third color light emitting unit located in the first display region is in a range of 1.5 to 2.5.

For example, in an embodiment of the present disclosure, the main body electrode of each first color light emitting unit in a row of light emitting unit groups, adjacent to the first display region, in the second display region has substantially the same shape and the same area as each first color light emitting unit located in the first display region; the main body electrode of each second color light emitting unit pair in the row of light emitting unit groups, adjacent to the first display region, in the second display region has approximately the same area as the main body electrode of each second color light emitting unit pair located in the first display region; the main body electrode of each third color light emitting unit in the row of light emitting unit groups, adjacent to the first display region, in the second display region has substantially the same shape and the same area as each third color light emitting unit located in the first display region.

Another embodiment of the present disclosure provides a display device, including the display substrate as mentioned above.

BRIEF DESCRIPTION OF DRAWINGS

In order to more clearly explain the technical solution of the embodiments of the present disclosure, the following will briefly introduce the drawings of the embodiments. Obviously, the drawings in the following description only relate to some embodiments of the present disclosure, but not limit the present disclosure.

DETAILED DESCRIPTION

Figure 1:
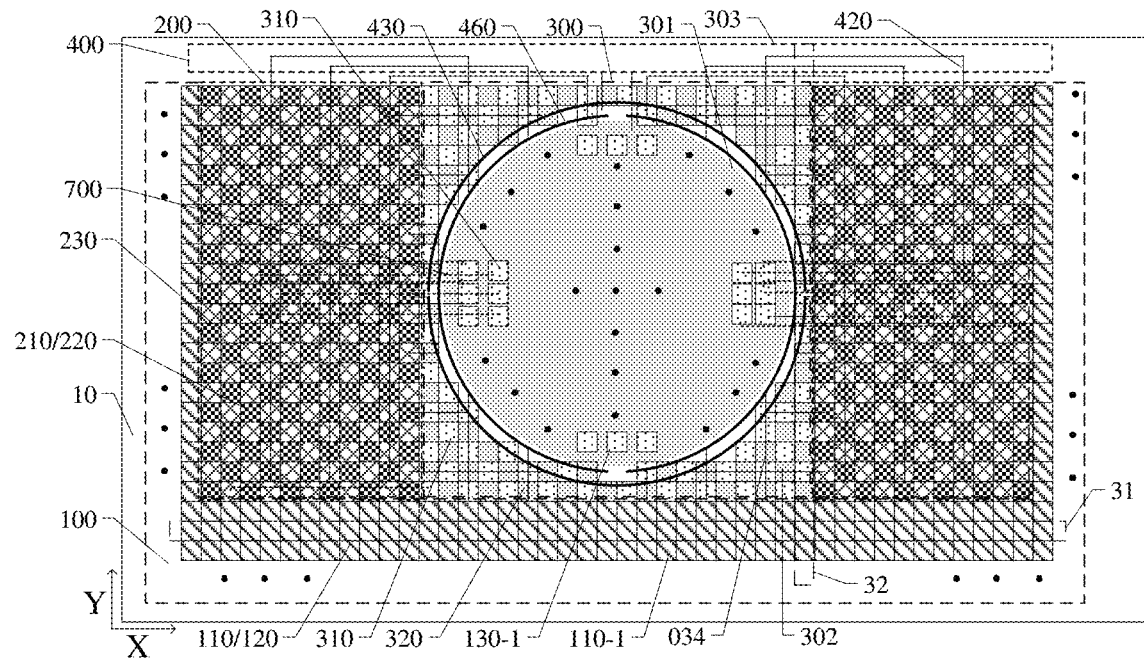
FIG. 1 is a schematic diagram of a partial plane structure of a display substrate according to an embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure.

Based on the described embodiments herein, those skilled in the art can obtain, without any inventive work, other embodiment(s) which should be within the scope of the present disclosure.

Unless otherwise defined, the technical terms or scientific terms used in the present disclosure shall have their ordinary meanings as understood by those with ordinary skills in the field to which the present disclosure belongs. The words "first", "second" and the like used in the present disclosure do not indicate any order, quantity or importance, but are only used to distinguish different components. Words such as "comprising" or "including" refer to that the elements or objects appearing before the word cover the listed elements or objects appearing after the word and their equivalents, without excluding other elements or objects.

In the research, the inventor(s) of the present application has noticed that, at present, in an organic light emitting diode display device of the under-screen camera design, the display brightness and current of a low-density display region (L region) are at least twice lower than the display brightness and current of a high-density display region (H region), which will affect the display effect.

The embodiments of the present disclosure provide a display substrate and a display device. The display substrate includes: a base substrate, including a first display region, a second display region and a third display region, the first display region includes a plurality of first light emitting unit groups and a plurality of first pixel circuit groups respectively connected with the plurality of first light emitting unit groups, the second display region includes a plurality of second light emitting unit groups, a plurality of second pixel circuit groups and a plurality of third pixel circuit groups, the plurality of second light emitting unit groups are respectively connected with the plurality of second pixel circuit groups, the third display region includes a plurality of third light emitting unit groups, which are respectively connected with the plurality of third pixel circuit groups, and a density of the plurality of second light emitting unit groups and a density of the plurality of third light emitting unit groups are both smaller than a density of the plurality of first light emitting unit groups, each light emitting unit group includes a plurality of light emitting units, and each of the light emitting units includes a first electrode, a light emitting layer, and a second electrode which are sequentially arranged along a direction perpendicular to the base substrate, and the second electrode is on a side of the light emitting layer facing the base substrate. The second electrode of each of the light emitting units includes a main body electrode and a connection electrode, the connection electrode is configured to connect a pixel circuit, and each light emitting unit group located in display regions includes a plurality of light emitting units of different colors; among the light emitting units of a same color, an area of the main body electrode of at least one light emitting unit located in a non-edge region of the second display region is greater than an area of at least one main body electrode located in the third display region, the brightness of at least one of the second display region and the third display region can be increased on the basis of ensuring the service life of the luminescent material of the luminescent unit, and a more uniform full screen visual display effect can be realized.

Hereinafter, the display substrate and the display device provided by the embodiments of the present disclosure are described below with reference to the accompanying drawings.

FIG. 1 is a schematic diagram of a partial plane structure of a display substrate according to an embodiment of the present disclosure. As illustrated by FIG. 1, the display substrate includes a base substrate 10. The display substrate includes a first display region 100 and a second display region 200. For example, the display substrate further includes a third display region 300. For example, the second display region 200 is located around the third display region 300, for example, at both sides of the third display region 300 along an X direction, and the first display region 100 is located around the second display region 200 and the third display region 300. For example, the second display region 200 and the third display region 300 are located at an edge of a display region, that is, the display substrate includes the display region and a peripheral region surrounding the display region, and edges of the second display region 200 and the third display region 300 away from the first display region 100 are connected with the peripheral region. That is, the first display region 100 is located only at one side of the third display region 300 along a Y direction. For example, the shape of the third display region 300 may be a rectangle, two edges of the rectangle extending in the Y direction are respectively connected with the second display regions 200 located on both sides of the rectangle, and one edge of the rectangle extending in the X direction is connected with the peripheral region and the other edge is connected with the first display region 100. For example, the second display region 200 is located between the first display region 100 and the third display region 300 arranged in the X direction, and one of the two edges of the second display region 200 extending in the X direction is connected with the peripheral region, and the other one of the two edges is connected with the first display region 100.

As illustrated by FIG. 1, the first display region 100 includes a plurality of first light emitting unit groups 110 and a plurality of first pixel circuit groups 120 respectively connected with the first light emitting unit groups 110. For example, one first light emitting unit group 110 can be connected with one first pixel circuit group 120 to drive the first light emitting unit group 110 to emit light, and both the first light emitting unit group 110 and the first pixel circuit group 120 driving the first light emitting unit group 110 to emit light are located in the first display region 100.

As illustrated by FIG. 1, the second display region 200 includes a plurality of second light emitting unit groups 210 and a plurality of second pixel circuit groups 220, and the second light emitting unit groups 210 are connected with the second pixel circuit groups 220, respectively. For example, the second display region 200 further includes a plurality of third pixel circuit groups 230. For example, one second light emitting unit group 210 can be connected with one second pixel circuit group 220 to drive the second light emitting unit group 210 to emit light, and both the second light emitting unit group 210 and the second pixel circuit group 220 driving the second light emitting unit group 210 to emit light are located in the second display region 200. For example, the third display region 300 includes a plurality of third light emitting unit groups 310, which are respectively connected with the plurality of third pixel circuit groups 230, that is, the third light emitting unit groups 310 located in the third display region 300 are connected with the third pixel circuit groups 230 located in the second display region 200, and the third light emitting unit groups 310 and the third pixel circuit groups 230 driving the third light emitting unit groups 310 to emit light are located in different display regions. For example, as illustrated by FIG. 1, a central region 301 of the third display region 300 is provided with only the third light emitting unit groups 310 which are transparent, but no non-transparent pixel circuit group. This central region 301 can be used as an under-screen camera region, which can have high light transmittance to realize an imaging function, and can be connected with pixel circuit groups in other regions to realize light emission, without affecting the display function of the screen.

As illustrated by FIG. 1, a density of the plurality of second light emitting unit groups 210 is smaller than a density of the plurality of first light emitting unit groups 110. For example, a density of the plurality of third light emitting unit groups 310 is smaller than the density of the plurality of first light emitting unit groups 110. The density of the light emitting unit groups (i.e., pixels-per-inch) in the under-screen camera region (the central region of the third display region) is lower than the density of the light emitting unit groups in the normal display region (the first display region), a camera can be provided below the low pixels-per-inch region that can allow more light to pass through. The above-mentioned "the density of the plurality of second light emitting unit groups 210 and the density of the plurality of third light emitting unit groups 310 are both smaller than the density of the plurality of first light emitting unit groups 110" refers to that the number of second light emitting unit groups is smaller than the number of first light emitting unit groups in the same area.

For example, the first display region 100 is the main display region with high resolution (PPI, Pixel-Per-Inch), that is, the first display region 100 is provided with high density of sub-pixels for display. Each sub-pixel includes a light emitting unit and a pixel circuit driving the light emitting unit. The third display region 300 can allow light incident from a display side of the display substrate to pass through the display substrate and reach a back side of the display substrate, so that the sensors and other components located at the back side of the display substrate can work normally. The embodiment of the present disclosure is not limited thereto. For example, the third display region 300 may also allow light emitted from the back side of the display substrate to pass through the display substrate and reach the display side of the display substrate. The third display region 300 and the second display region 200 also include a plurality of sub-pixels for display. However, because the pixel circuits of sub-pixels are usually opaque to light, in order to improve the light transmittance of the central region 301 of the third display region 300, the light emitting units of sub-pixels of the third display region 300 can be physically separated from the pixel circuits driving the light emitting units. For example, the pixel circuit connected with the light emitting unit group in the third display region 300 (for example, as shown by the box in the third display region 300 in FIG. 1) may be arranged in the second display region 200, thereby occupying a part of the space of the second display region 200. The remaining space of the second display region 200 is used to set the pixels of the second display region 200 (including the second pixel circuit group 220 and the second light emitting unit group 210). For example, each dot filled box in the second display region 200 represents one pixel. In this case, the pixels in the second display region 200 and the third pixel circuit groups 230 connected with the third light emitting unit groups 310 in the third display region 300 are arranged in an array in the second display region 200. Therefore, the resolution of the third display region 300 and the second display region 200 is lower than the resolution of the first display region 100, that is, the density of pixels arranged for display in the third display region 300 and the second display region 200 is smaller than the density of pixels of the first display region 100.

Figure 2:
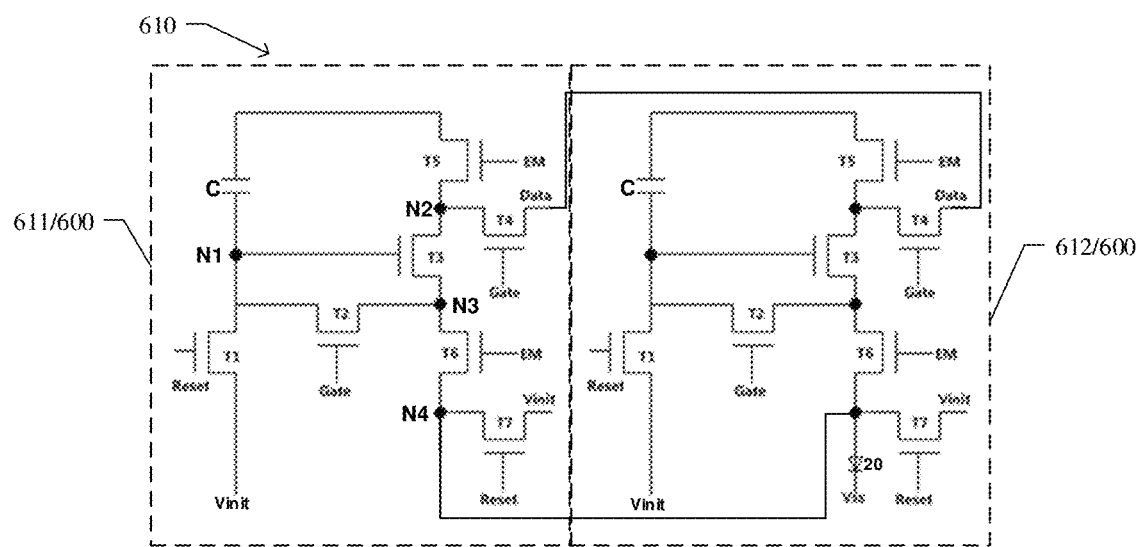
FIG. 2 is a pixel circuit equivalent diagram of at least one of a second pixel circuit group and a third pixel circuit group shown in FIG. 1.

FIG. 2 is an equivalent diagram of a pixel circuit pair in the second pixel circuit group and the third pixel circuit group shown in FIG. 1. As illustrated by FIG. 2, each pixel circuit group includes a plurality of pixel circuits 600. The second pixel circuit group 220 includes a plurality of first pixel circuit units 610, and the first pixel circuit units 610 include at least a first pixel circuit 611 and a second pixel circuit 612. For example, the first pixel circuit unit 610 may include two pixel circuits, and the first pixel circuit unit 610 may be referred to as a pixel circuit pair 610. The embodiment of the present disclosure schematically shows that the first pixel circuit unit includes two pixel circuits, but is not limited thereto, and the first pixel circuit unit may also include three pixel circuits or more pixel circuits. For example, each light emitting unit group includes a plurality of light emitting units, and the first pixel circuit group 210 includes a plurality of pixel circuits, and each pixel circuit is configured to be connected with one light emitting unit to drive the light emitting unit to emit light; the second pixel circuit group 220 includes a plurality of pixel circuit pairs 610, and each pixel circuit pair 610 of the second pixel circuit group 220 is configured to be connected with one light emitting unit to drive the light emitting unit to emit light.

For example, the third pixel circuit group 230 includes a plurality of second pixel circuit unit, each second pixel circuit unit includes at least a third pixel circuit and a fourth pixel circuit, and at least two pixel circuits in the second pixel circuit unit are configured to be connected with the same light emitting unit to drive the light emitting unit to emit light. For example, the second pixel circuit unit may include two pixel circuits, and the second pixel circuit unit may also be referred to as the pixel circuit pair 610. The embodiment of the present disclosure schematically shows that the second pixel circuit unit includes two pixel circuits, but is not limited thereto, and the second pixel circuit unit may also include three pixel circuits or more pixel circuits.

For example, the display substrate also includes a reset power signal line, a data line, a scanning signal line, a power signal line, a reset control signal line, and a light emitting control signal line located on the base substrate. As illustrated by FIG. 2, each pixel circuit 600 includes a data writing transistor T4, a driving transistor T3, a threshold compensation transistor T2, and a first reset transistor T7. The first electrode of the threshold compensation transistor T2 is connected with a first electrode of the driving transistor T3, the second electrode of the threshold compensation transistor T2 is connected with a gate electrode of the driving transistor T3, and a first electrode of the first reset transistor T7 is connected with the reset power signal line to receive a reset signal Vinit. A second electrode of the first reset transistor T7 is connected with the light emitting unit, and a first electrode of the data writing transistor T4 is connected with a second electrode of the driving transistor T3. For example, as illustrated by FIG. 2, the pixel circuit of each sub-pixel further includes a storage capacitor C, a first light emitting control transistor T6, a second light emitting control transistor T5, and a second reset transistor T1. A gate electrode of the data transistor T4 is electrically connected with the scanning signal line to receive the scanning signal Gate; a first electrode of the storage capacitor C is electrically connected with the power signal line, and a second electrode of the storage capacitor C is electrically connected with the gate electrode of the driving transistor T3; a gate electrode of the threshold compensation transistor T2 is electrically connected with the scanning signal line to receive the compensation control signal; a gate electrode of the first reset transistor T7 is electrically connected with the reset control signal line to receive the reset control signal Reset; the first electrode of the second reset transistor T1 is electrically connected with the reset power signal line to receive the reset signal Vinit, a second electrode of the second reset transistor T1 is electrically connected with the gate electrode of the driving transistor T3, and the gate electrode of the second reset transistor T1 is electrically connected with the reset control signal line to receive the reset control signal Reset; a gate electrode of the first light emitting control transistor T6 is electrically connected with the light emitting control signal line to receive the light emission control signal EM; a first electrode of the second light emitting control transistor T5 is electrically connected with the power signal line, a second electrode of the second light emitting control transistor T5 is electrically connected with the second electrode of the driving transistor T3, and a gate electrode of the second light emitting control transistor T5 is electrically connected with the light emitting control signal line to receive the light emitting control signal EM. The above-mentioned power signal line refers to a signal line that outputs a voltage signal VDD, and can be connected with a voltage source to output a constant voltage signal, such as a positive voltage signal.

For example, the scanning signal and the compensation control signal may be the same, that is, the gate electrode of the data writing transistor T3 and the gate electrode of the threshold compensation transistor T2 may be electrically connected with the same signal line to receive the same signal, thereby reducing the number of signal lines. For example, the gate electrode of the data writing transistor T3 and the gate electrode of the threshold compensation transistor T2 can also be electrically connected with different signal lines, that is, the gate electrode of the data writing transistor T3 is electrically connected with the first scanning signal line, and the gate electrode of the threshold compensation transistor T2 is electrically connected with the second scanning signal line, and the signals transmitted by the first scanning signal line and the second scanning signal line can be the same or different, so that the gate electrode of the data writing transistor T3 and the threshold compensation transistor T2 can be separately and independently controlled, thus increasing the flexibility of controlling the pixel circuit.

For example, the light emitting control signals input to the first light emitting control transistor T6 and the second light emitting control transistor T5 may be the same, that is, the gate electrode of the first light emitting control transistor T6 and the gate electrode of the second light emitting control transistor T5 may be electrically connected with the same signal line to receive the same signal, thereby reducing the number of signal lines. For example, the gate electrode of the first light emitting control transistor T6 and the gate electrode of the second light emitting control transistor T5 may be electrically connected with different light emitting control signal lines, and the signals transmitted by different light emitting control signal lines may be the same or different.

For example, the reset control signals input to the first reset transistor T7 and the second reset transistor T1 may be the same, that is, the gate electrode of the first reset transistor T7 and the gate electrode of the second reset transistor T1 may be electrically connected with the same signal line to receive the same signal, thereby reducing the number of signal lines. For example, the gate electrode of the first reset transistor T7 and the gate electrode of the second reset transistor T1 may be electrically connected with different reset control signal lines, and the signals on different reset control signal lines may be the same or different.

For example, as illustrated by FIG. 2, upon the display substrate being working, in the first stage of screen display, the second reset transistor T1 is turned on to initialize the voltage of the N1 node; in the second stage, the same data signal DATA is stored in two N1 nodes of two pixel circuits 600 through two connected data writing transistors T4, and two driving transistors T3 and two threshold compensation transistors T2 respectively connected with the two connected data writing transistors T4. In the third light emitting stage, the second light emitting control transistors T5, the driving transistors T3 and the first light emitting control transistors T6 in the two pixel circuits 600 (that is, the pixel circuit pair 610 composed of the first pixel circuit 611 and the second pixel circuit 612) are all turned on to transmit the same data signals to the two N4 nodes. In this case, the N4 nodes of the two pixel circuits 600 are connected to drive the same light emitting unit 20 to emit light together, which can increase the current and brightness.

It should be noted that, in the embodiment of the present disclosure, the pixel circuit of the sub-pixel can be a structure including other numbers of transistors, such as a 7T2C structure, a 6T1C structure, a 6T2C structure or a 9T2C structure, in addition to the 7T1C (i.e., seven transistors and one capacitor) structure shown in FIG. 2, and the embodiment of the present disclosure is not limited thereto. As long as the data writing transistors T4 of the two pixel circuits are connected, and the N4 nodes of the two pixel circuits are connected to realize the common driving of the same light emitting unit to emit light.

Figure 3A:
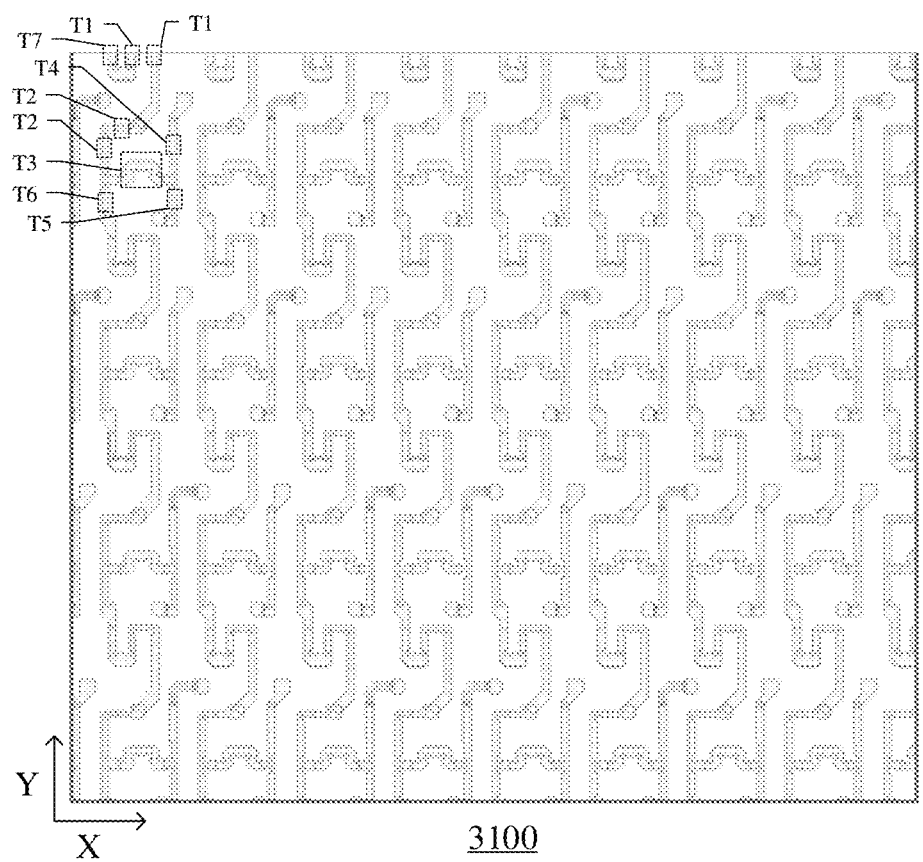
FIG. 3A is a schematic diagram of a partial plane structure of an active semiconductor layer of a pixel circuit in a second display region according to an embodiment of the present disclosure.

FIG. 3A is a schematic diagram of a partial plane structure of an active semiconductor layer of a pixel circuit in a second display region according to an embodiment of the present disclosure. As illustrated by FIG. 3A, the active semiconductor layer 3100 may be formed by patterning a semiconductor material. The active semiconductor layer 3100 can be used to manufacture the active layers of the second reset transistor T1, the threshold compensation transistor T2, the driving transistor T3, the data writing transistor T4, the second light emitting control transistor T5, the first light emitting control transistor T6 and the first reset transistor T7 as above-mentioned. The active semiconductor layer 3100 includes an active layer pattern (channel region) and a doped region pattern (source and drain doped regions) of each transistor of each sub-pixel, and the active layer pattern and the doped region pattern of each transistor in the same pixel circuit are integrally arranged.

It should be noted that the active layer can include an integrated low-temperature polysilicon layer, and the source region and the drain region can be conducted by doping to realize the electrical connection of each structure. That is, the active semiconductor layer of each transistor of each sub-pixel is an integral pattern formed by p-silicon, and each transistor in the same pixel circuit includes a doped region pattern (i.e., a source region and a drain region) and an active layer pattern, and the active layers of different transistors are separated by a doped structure.

For example, the active semiconductor layer 3100 can be made of amorphous silicon, polysilicon, oxide semiconductor materials, etc. It should be noted that the source region and the drain region as above-mentioned may be regions doped with N-type impurities or P-type impurities.

Figure 3B:
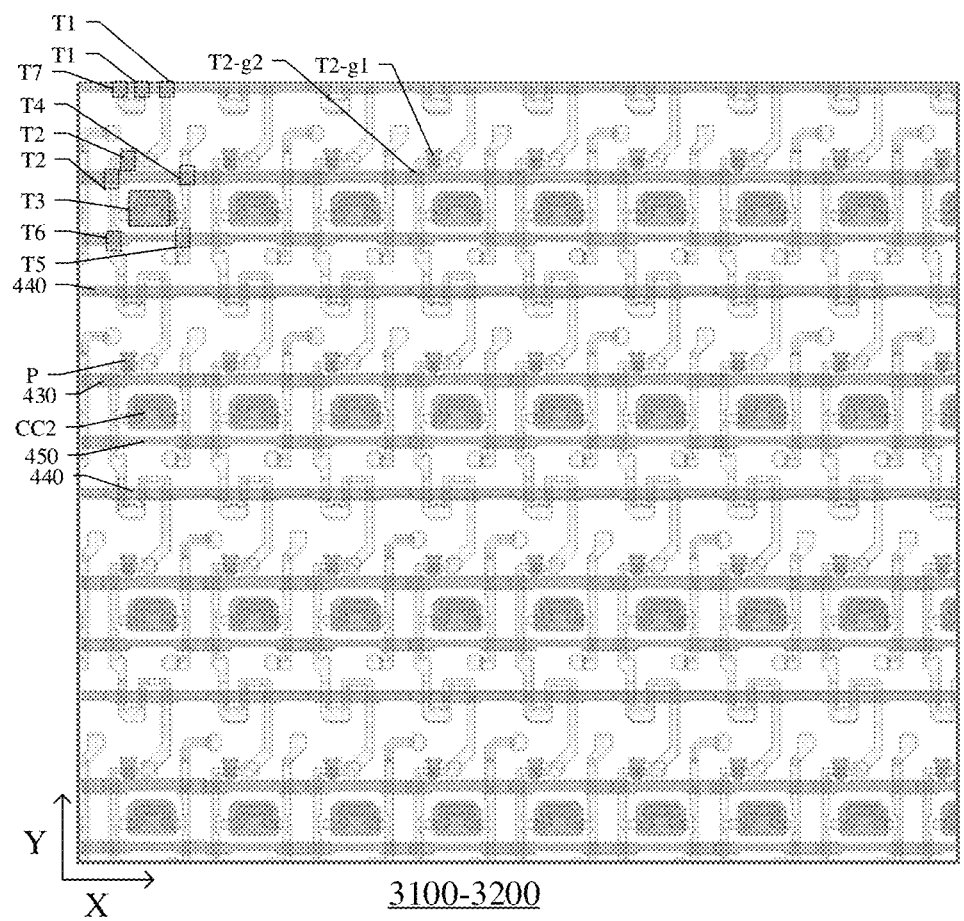
FIG. 3B is a schematic diagram of a stacked structure of an active semiconductor layer and a first conductive layer in a second display region according to an embodiment of the present disclosure.

FIG. 3B is a schematic diagram of a stacked structure of an active semiconductor layer and a first conductive layer in a second display region according to an embodiment of the present disclosure. The display substrate includes a gate insulating layer at a side of the active semiconductor layer away from the base substrate, which is used to insulate the active semiconductor layer 3100 from the first conductive layer 3200 (i.e., a gate metal layer) formed later. FIG. 3B shows that the display substrate includes a first conductive layer 3200, which is disposed on the gate insulating layer so as to be insulated from the active semiconductor layer 3100. The first conductive layer 320 may include a second electrode CC2 of the capacitor C, a plurality of scanning signal lines 430, a plurality of reset control signal lines 440, a plurality of light emitting control signal lines 450, and gate electrodes of the second reset transistor T1, the threshold compensation transistor T2, the driving transistor T3, the data writing transistor T4, the second light emitting control transistor T5, the first light emitting control transistor T6, and the first reset transistor T7.

For example, as illustrated by FIG. 3B, the gate electrode of the data writing transistor T3 may be a part where the scanning signal line 430 overlaps with the active semiconductor layer 3100; the gate electrode of the first light emitting control transistor T6 may be a first part where the light emitting control signal line 450 overlaps with the active semiconductor layer 3100, and the gate electrode of the second light emitting control transistor T5 may be a second part where the light emitting control signal line 450 overlaps with the active semiconductor layer 3100. The gate electrode of the second reset transistor T1 is a first part where the reset control signal line 440 overlaps with the active semiconductor layer 3100, and the gate electrode of the first reset transistor T7 is a second part where the reset control signal line 440 overlaps the active semiconductor layer 3100. The threshold compensation transistor T2 may be a thin film transistor with a double gate structure, the first gate electrode of the threshold compensation transistor T2 may be a part where the scanning signal line 430 overlaps with the active semiconductor layer 3100, and the second gate electrode of the threshold compensation transistor T2 may be a part where a protruding structure P protruding from the scanning signal line 430 overlaps with the active semiconductor layer 3100. As illustrated by FIG. 3B, the gate electrode of the driving transistor T1 may be the second electrode CC2 of the capacitor C.

It should be noted that the dotted rectangular boxes in FIG. 3B show the overlapping parts of the first conductive layer 3200 and the active semiconductor layer 3100. As the channel region of each transistor, the active semiconductor layer at both sides of each channel region are conducted as the first electrode and the second electrode of each transistor by ion doping and other processes. The source electrode and the drain electrode of the transistor can be symmetrical in structure, so its source electrode and drain electrode can have no difference in physical structure. In the embodiment of the present disclosure, in order to distinguish transistors, except the gate electrode as the control electrode, one of the source electrode and the drain electrode is directly described as the first electrode and the other of the source electrode and the drain electrode is the second electrode, so the first electrode and the second electrode of all or part of the transistors in the embodiment of the present disclosure can be interchanged as required.

For example, as illustrated by FIG. 3B, the scanning signal line 430, the reset control signal line 440 and the light emitting control signal line 450 are arranged along the second direction (Y direction). The scanning signal line 430 is located between the reset control signal line 440 and the light emitting control signal line 450. The first direction and the second direction in the embodiment of the present disclosure are directions that intersect each other, for example, the first direction is perpendicular to the second direction. The first direction and the second direction in the embodiment of the present disclosure can be interchanged.

For example, in the second direction, the second electrode CC2 of the capacitor C (i.e., the gate electrode of the driving transistor T1) is located between the scanning signal line 430 and the light emitting control signal line 450. The protruding structure P protruding from the scanning signal line 430 is located at a side of the scanning signal line 430 away from the light emitting control signal line 450.

For example, a first insulating layer is formed on the first conductive layer 3200 to insulate the first conductive layer 3200 from the second conductive layer 3300 formed later.

Figure 3C:
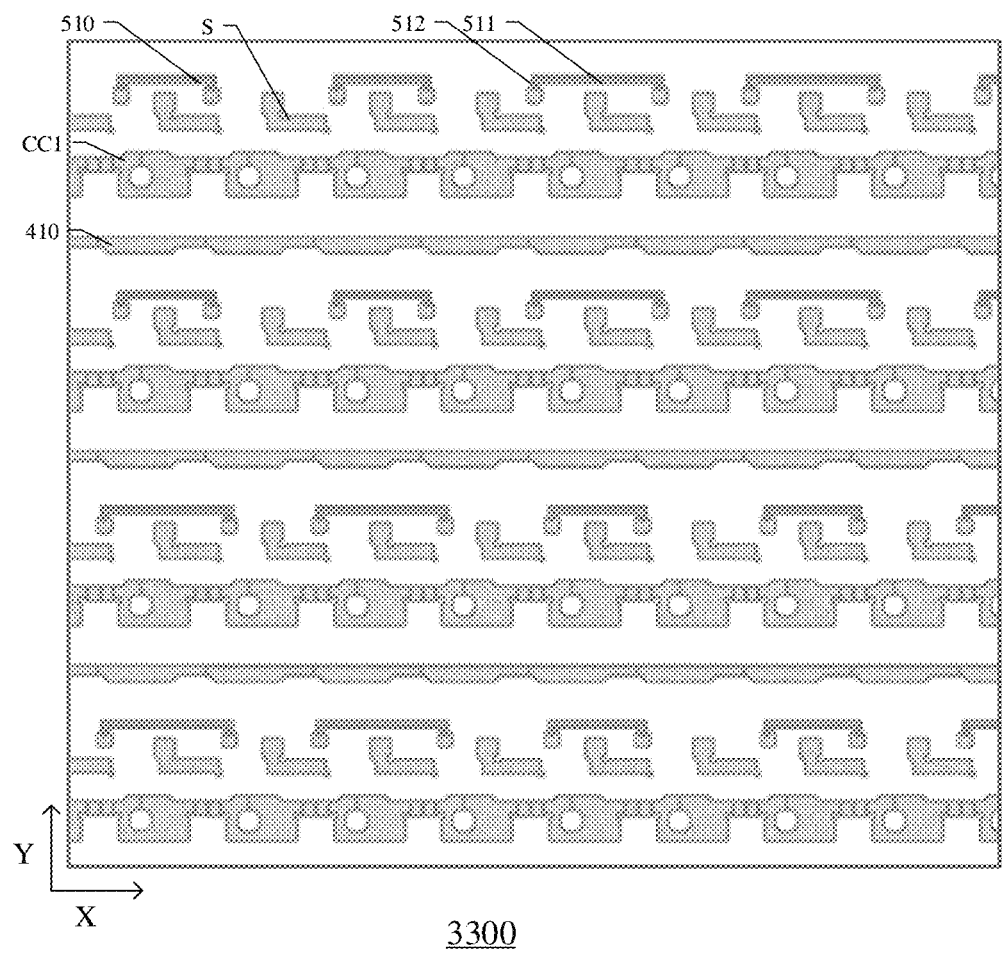
FIG. 3C is a schematic diagram of a partial plane structure of a second conductive layer in a second display region according to an embodiment of the present disclosure.
Figure 3D:
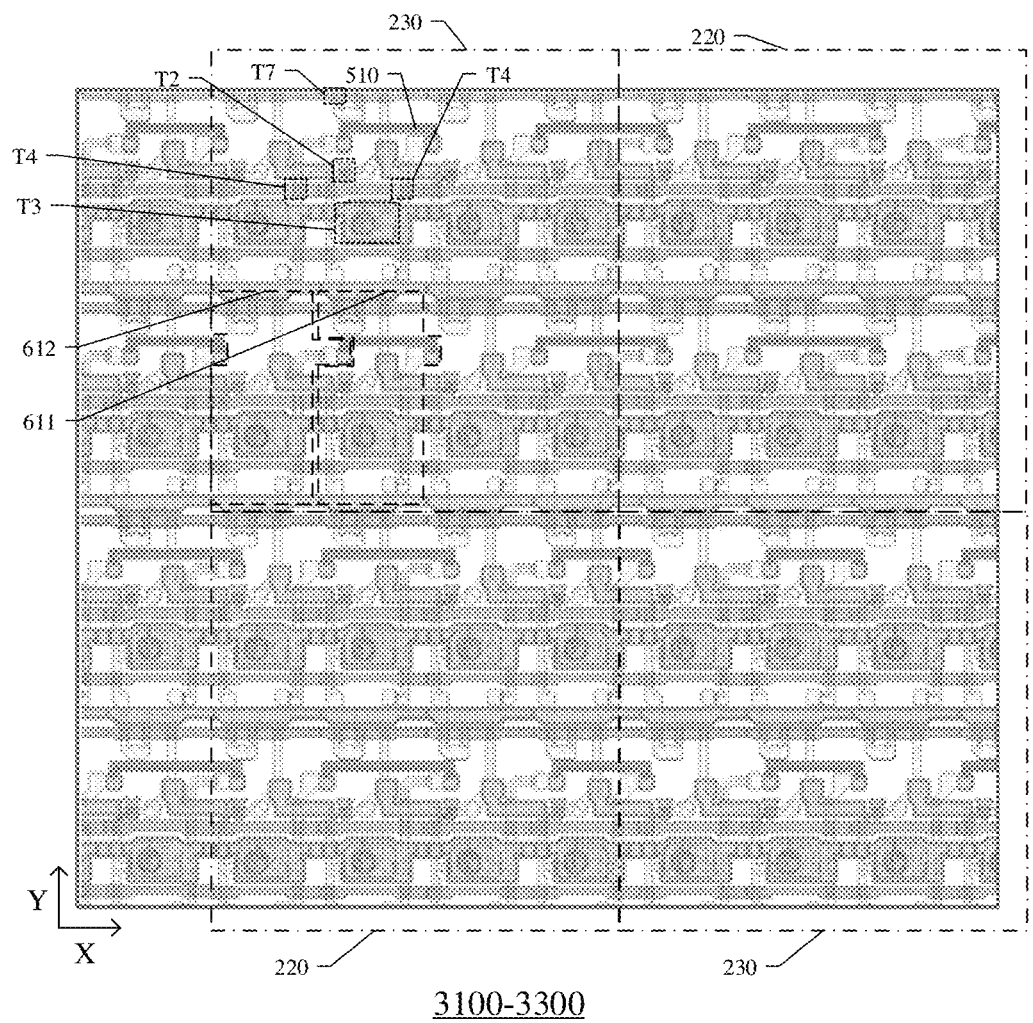
FIG. 3D is a schematic diagram of a stacked structure of an active semiconductor layer, a first conductive layer and a second conductive layer in a second display region according to an embodiment of the present disclosure.

FIG. 3C is a schematic diagram of a partial plane structure of a second conductive layer in a second display region according to an embodiment of the present disclosure, and FIG. 3D is a schematic diagram of a stacked structure of an active semiconductor layer, a first conductive layer and a second conductive layer in a second display region according to an embodiment of the present disclosure. As illustrated by FIGS. 3C to 3D, the second conductive layer 330 includes the first electrode CC1 of the capacitor C and a plurality of reset power signal lines 410 extending in the first direction. The first electrode CC1 of the capacitor C and the second electrode CC2 of the capacitor C at least partially overlap to form the capacitor C.

As illustrated by FIGS. 3C to 3D, the display substrate provided by the embodiment of the present disclosure further includes a plurality of first connection portions 510, and the first ends of at least some of the first connection portions 510 are connected with the second electrodes of the data writing transistors T4 of the first pixel circuits 611 in the first pixel circuit units (for example, the first end of the first connection portion 510 can be directly connected with the second electrode of the data writing transistor T4 of the first pixel circuit 611 in the first pixel circuit unit, and the first end of the first connection portion 510 may be electrically connected with the second electrode of the data writing transistor T4 through a conductive layer switching layer), second ends of the at least some of first connection portions 510 are connected with the second electrodes of the data writing transistors T4 of the second pixel circuits 612 in the first pixel circuit units so that at least two data writing transistors T4 of the first pixel circuit unit are connected with the same data line, and along the second direction, at least portion of the first connection portions 510 is located between the second electrode of the data writing transistor T2 and the first electrode of the first reset transistor T7 in the first pixel circuit 611.

In the embodiment of the present disclosure, the second electrodes of the data writing transistors of at least two pixel circuits in the second display region are connected through the first connection portion to drive one light emitting unit to emit light, which can increase the current and brightness of the light emitting unit in the second display region, for example, the current and brightness of the light emitting unit in the second display region can be increased to 1.8 to 2 times that in the case of driving by one pixel circuit, thus solving the problem of low current and brightness in the second display region and realizing a more uniform visual display effect of a full screen.

For example, the first ends of part of the first connection portions 510 are connected with the second electrodes of the data writing transistors T4 of the third pixel circuits in the second pixel circuit units, the second ends of the part of the first connection portions 510 are connected with the second electrodes of the data writing transistors T4 of the fourth pixel circuits in the second pixel circuit units to connect at least two data writing transistors T4 of the second pixel circuit unit with the same data line, and the first connection portion 510 is located between the second electrode of the data writing transistor T2 and the first electrode of the first reset transistor T7 in the third pixel circuit along the second direction. For the convenience of subsequent description, the first pixel circuit unit and the second pixel circuit unit in the present disclosure are be the called pixel circuit pairs, so the two pixel circuits included in each pixel circuit unit are respectively called a first pixel circuit and the second pixel circuit, that is, the third pixel circuit in the second pixel circuit unit can be called the first pixel circuit, and the fourth pixel circuit in the second pixel circuit unit can be called the second pixel circuit.

For example, along the second direction, the first connection portion 510 is located between the second electrode of the threshold compensation transistor T3 and the first electrode of the first reset transistor T7 in the first pixel circuit 611.

For example, the first connection portion 510 is arranged in the same layer as the reset power signal line 410.

For example, a second insulating layer is formed on the second conductive layer 3300, which is used to insulate the second conductive layer 3300 from the subsequently formed source drain metal layer 3400.

Figure 3E:
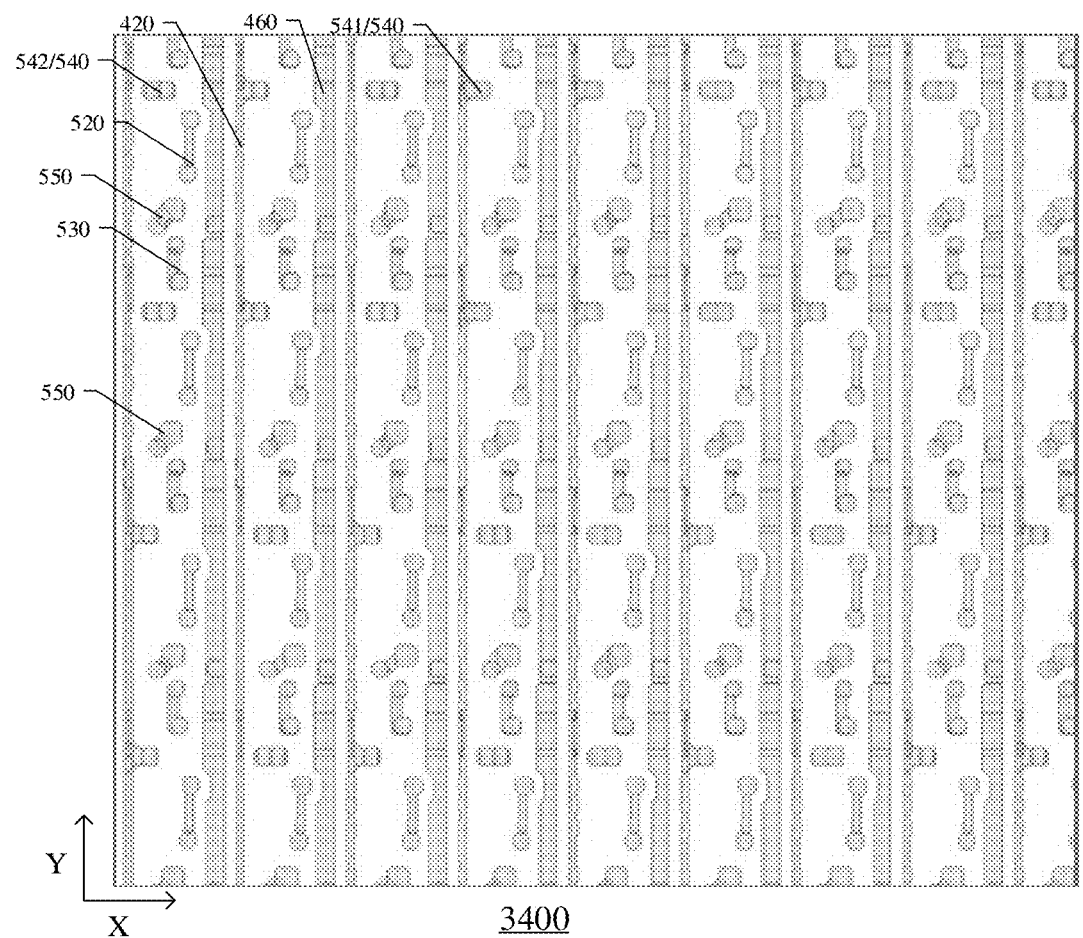
FIG. 3E is a schematic diagram of a partial plane structure of a source drain metal layer of a second display region according to an embodiment of the present disclosure.
Figure 3F:
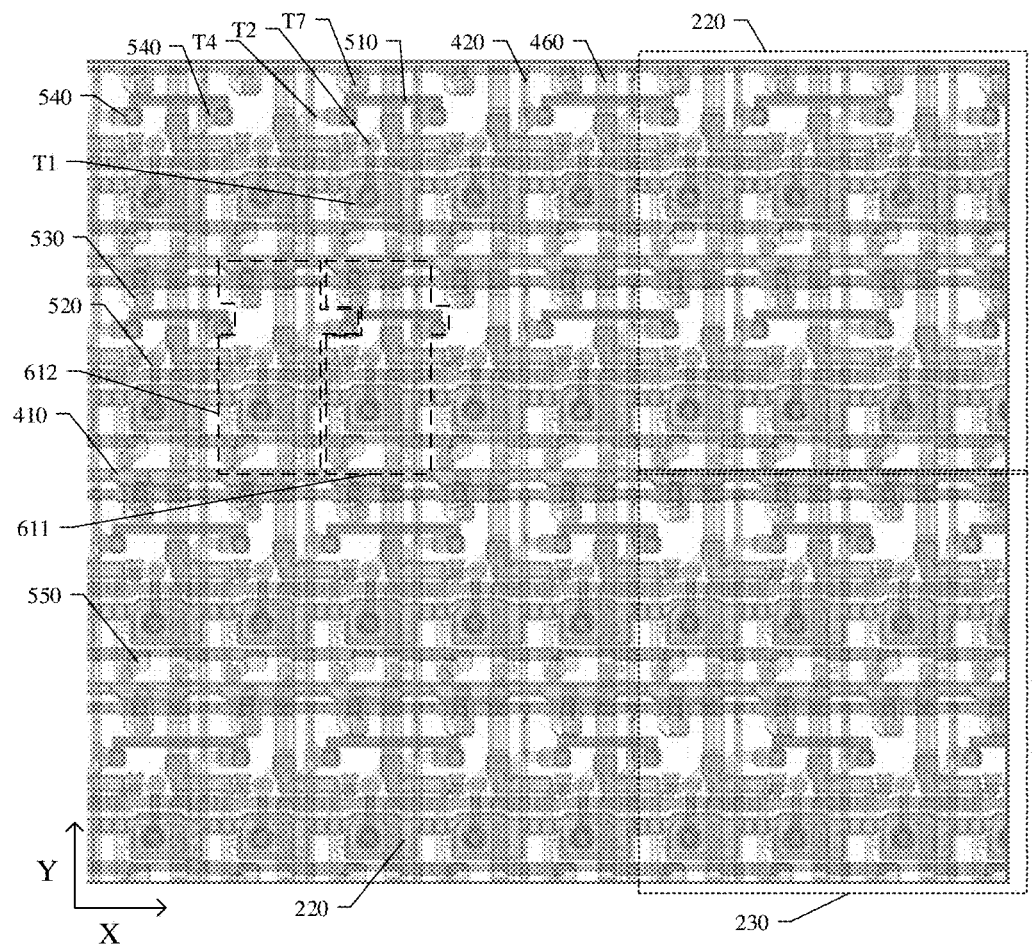
FIG. 3F is a schematic diagram of a stacked structure of an active semiconductor layer, a first conductive layer, a second conductive layer and a source drain metal layer in a second display region according to an embodiment of the present disclosure.

For example, FIG. 3E is a schematic diagram of a partial plane structure of a source drain metal layer of a second display region according to an embodiment of the present disclosure, and FIG. 3F is a schematic diagram of a stacked structure of an active semiconductor layer, a first conductive layer, a second conductive layer and a source drain metal layer in a second display region according to an embodiment of the present disclosure. As illustrated by FIGS. 3E to 3F, the source drain metal layer 3400 includes a data line 420 and a power signal line 460 which extend in the second direction. The data line 420 is electrically connected with the second electrode of the data writing transistor T2 through a via hole penetrating through the gate insulating layer, the first insulating layer and the second insulating layer. The power signal line 460 is electrically connected with the first electrode of the second light emitting control transistor T5 through a via hole penetrating through the gate insulating layer, the first insulating layer and the second insulating layer. The power signal lines 460 and the data lines 420 are alternately arranged in the first direction. The power signal line 460 is electrically connected with the first electrode CC1 of the capacitor C through a via hole penetrating through the second insulating layer.

For example, a passivation layer and a planarization layer may be arranged at a side of the source drain metal layer 3400 away from the base substrate to protect the source drain metal layer 3400.

For example, FIGS. 3D to 3F schematically show some pixel circuits in the second pixel circuit group 220 and some pixel circuits in the third pixel circuit group 230. The embodiment of the present disclosure schematically shows that the second pixel circuit group 220 and the third pixel circuit group 230 each includes a pixel circuit pair, and the pixel circuit pair includes a first pixel circuit 611 and a second pixel circuit 612 arranged in a first direction, and the second electrodes of the data writing transistors T4 of the two pixel circuits in each pixel circuit pair are connected through the first connection portion 510 to drive the same light emitting unit to emit light. The embodiment of the present disclosure is not limited thereto. For example, only the second pixel circuit group may include the above pixel circuit pair, or only the third pixel circuit group may include the above pixel circuit pair.

For example, as illustrated by FIGS. 3D to 3F, the second pixel circuit group 220 and the third pixel circuit group 230 may include eight pixel circuits arranged in two rows, that is, four pixel circuit pairs arranged in a two-dimensional array. The first pixel circuit group does not include the above pixel circuit pair (not shown), but only includes four pixel circuits arranged in a two-dimensional array. Two adjacent pixel circuits arranged in the first direction in the first pixel circuit group each drives one light emitting unit to emit light, and two data writing transistors in the two adjacent pixel circuits are independent from each other and connected with different data lines. The layout difference between the first pixel circuit group and the second pixel circuit group in the embodiment of the present disclosure mainly lies in whether the first connection portion is provided or not, and the position of the second electrode of the data writing transistor connected with the first connection portion.

For example, as illustrated by FIGS. 3D to 3F, the display substrate provided in the embodiment of the present disclosure can adopt Quarter High Definition (QHD), but because the distance between the second electrode of the threshold compensation transistor and the first electrode of the first reset transistor of each pixel circuit designed with this resolution in the second direction is small, for example, less than 2 microns, for example, 1.4-1.8 microns, it is difficult to provide a first connection portion between the second electrode of the threshold compensation transistor and the first electrode of the first reset transistor, which connects the second electrodes (data input nodes) of the two data writing transistors of the pixel circuit pair.

The size of pixels in QHD resolution products is generally smaller than that in Full High Definition (FHD) products, in the embodiment of the present disclosure, the pixel circuit with QHD resolution is designed into the pixel pitch with FHD resolution, thereby increasing the distance in the second direction between the second electrode of the threshold compensation transistor T2 and the first electrode of the first reset transistor T7 in each pixel circuit, so as to ensure that the data input nodes of the two pixel circuits of the pixel circuit pair are connected through via holes and the first connection portion.

For example, as illustrated by FIGS. 3D to 3F, with respect to a display substrate in which the second display region includes a plurality of light emitting units and a plurality of pixel circuits connected with the plurality of light emitting units in one-to-one correspondence, and dummy pixel circuits that are not connected with any light emitting units are arranged between adjacent pixel circuits, in the embodiment of the present disclosure, the dummy pixel circuit is connected with the pixel circuit connected with the light emitting unit in the second display region by the first connection portion, in this way, on the basis of changing the overall structure of the pixel circuit as little as possible, the dummy pixel circuits can be effectively utilized, so that the current and brightness of the light emitting units of the second display region (at least one of the third display region and the second display region) can be increased, and a more uniform visual display effect of the full screen can be realized.

For example, a distance between the second electrode of the threshold compensation transistor T2 and the first electrode of the first reset transistor T7 in the second direction is in the range of 7-12 microns to arrange the first connection portion 510 between the second electrode of the threshold compensation transistor T2 and the first electrode of the first reset transistor T7.

For example, as illustrated by FIGS. 3A to 3F, each pixel circuit further includes a second connection portion 520 and a third connection portion 530 arranged in the same layer as the data line 420. The second connection portion 520 is configured to connect the second electrode of the threshold compensation transistor T2 with the gate electrode of the driving transistor T3, and the third connection portion 530 is configured to connect the first electrode of the first reset transistor T7 with the reset power signal line 410. For example, one end of the second connection portion 520 is electrically connected with the second electrode of the threshold compensation transistor T2 through a via hole penetrating through the gate insulating layer, the first insulating layer and the second insulating layer, and the other end of the second connection portion 520 is electrically connected with the gate electrode of the driving transistor T3 (i.e., the second electrode CC2 of the capacitor C) through a via hole penetrating through the first insulating layer and the second insulating layer. One end of the third connection portion 530 is electrically connected with the reset power signal line 410 through a via hole penetrating through the second insulating layer, and the other end of the third connection portion 530 is electrically connected with the first electrode of the first reset transistor T7 through a via hole penetrating through the gate insulating layer, the first insulating layer and the second insulating layer.

For example, as illustrated by FIGS. 3A to 3F, in the first pixel circuit 611, a distance in the second direction between the edges of the second connection portion 520 and the third connection portion 530 which are adjacent to each other is in the range of 7 to 12 microns to arrange the first connection portion 510 between the second connection portion 520 and the third connection portion 530. For example, in the first pixel circuit 611, the distance in the second direction between the edges of the second connection portion 520 and the third connection portion 530 which are adjacent to each other may be in the range of 8 to 11 microns.

For example, as illustrated by FIGS. 3A to 3F, the first connection portions 510 and the data lines 420 are located in different layers, and each of the first connection portion 510 overlaps with the data line 420 and the power signal line 460 in the third direction perpendicular to the base substrate. For example, one data line 420 and one power signal line 460 are arranged between two data writing transistors T4 included in the pixel circuit pair 610, and the first connection portion 510 connecting the two data writing transistors T4 as above-mentioned overlaps with both the data line 420 and the power signal line 460.

For example, as illustrated by FIGS. 3A to 3F, each pixel circuit further includes a fourth connection portion 540 disposed on the same layer as the data line 420, and the fourth connection portion 540 is configured to connect the first connection portion 510 and the second electrode of the data writing transistor T4. There is a gap between the fourth connection portion 540 of one pixel circuit in the pixel circuit pair 610 (e.g., the second pixel circuit 612) and the immediately adjacent data line 420, and the other pixel circuit in the pixel circuit pair 610 (e.g., the first pixel) is integrated with the data line 420 to realize that the pixel circuit pair 610 is connected with only one data line 420. The "immediately adjacent data line" in the above-mentioned "there is a gap between the fourth connection portion 540 and the immediately adjacent data line 420" means that there is no other data line between the fourth connection portion 540 and the data line 420.

For example, as illustrated by FIGS. 1, 3A to 3F, the plurality of first pixel circuit groups 210 are arranged in an array along the first direction and the second direction. In the first direction, the plurality of second pixel circuit groups 220 and the plurality of third pixel circuit groups 230 are alternately arranged; in the second direction, the plurality of second pixel circuit groups 220 and the plurality of third pixel circuit groups 230 are alternately arranged, and the second pixel circuit groups 220 and the third pixel circuit groups 230 are connected with different data lines 420.

For example, a straight line extending in the first direction passes through the second electrodes of two data writing transistors in the pixel circuit pair, and the whole of the first connection portion extends in the first direction. For example, different pixel circuit groups are connected with different data lines, so the lengths of the first connection portions in different pixel circuit groups in the first direction may be different. For example, in the same pixel circuit group, the lengths of the first connection portions, in different pixel circuit pairs, along the first direction may be different.

For example, as illustrated by FIG. 3E, taking the fourth connection portion 540 integrated with the data line 420 as the first sub-part 541, and the fourth connection portion 540 spaced apart from the immediately adjacent data line 420 as the second sub-part 542, and taking the second pixel circuit group including eight pixel circuits arranged in an array (four pixel circuits arranged in the row direction and two pixel circuits arranged in the column direction) as an example, in the second pixel circuit group, two first sub-sections 541 are arranged in the second direction (for example, in a column), two second sub-sections 542 are arranged in the second direction (for example, in the column), and the first sub-sections 541 and the second sub-sections 542 are alternately arranged in the first direction (for example, in the row direction). Similarly, the arrangement of the first sub-section and the second sub-section in the third pixel circuit group is the same as that in the second pixel circuit group. For the second pixel circuit groups and the third pixel circuit groups which are alternately arranged in the second direction, the first sub-part of the second pixel circuit group and the second sub-part of the third pixel circuit group are located in different columns so that the second pixel circuit group and the third pixel circuit group are connected with different data lines.

Because there is no pixel circuit pair design in the first pixel circuit group, the fourth connection portions of two adjacent pixel circuits arranged in the first pixel circuit group along the first direction or the second direction are integrated with corresponding data lines to realize the electrical connection between each pixel circuit and the corresponding data line.

For example, as illustrated by FIGS. 3A to 3F, the display substrate further includes a plurality of cover portions S arranged in the same layer as the first connection portion 510, and each threshold compensation transistor T2 includes two gate electrodes T2-g1 and T2-g2 and an active semiconductor layer 3100 located between the two gate electrodes. In the third direction, the covering portion S overlaps with the active semiconductor layer 3100, the data line 420 and the power signal line 460 between the two gate electrodes.

For example, when the threshold compensation transistor T2 is turned off, the active semiconductor layer between the two channels of the double-gate threshold compensation transistor T2 is in a floating state, and it is easily affected by the surrounding circuit voltage to jump, which will affect the leakage current of the threshold compensation transistor T2, thus affecting the luminous brightness. In order to keep the voltage of the active semiconductor layer between the two channels of the threshold compensation transistor T2 stable, a capacitor is formed between the covering portion S and the active semiconductor layer between the two channels of the threshold compensation transistor T2. The covering portion S can be connected with the power signal line 460 to obtain a constant voltage, so the voltage of the active semiconductor layer in a floating state can be kept stable. The overlap of the covering portion S with the active semiconductor layer between the two channels of the double-gate threshold compensation transistor T2 can also prevent the active semiconductor layer between the two gate electrodes from being illuminated to change its characteristics, for example, to prevent the voltage of this part of the active semiconductor layer from changing, so as to prevent crosstalk. For example, the power signal line 460 may be electrically connected with the covering portion S through a via hole penetrating through the second insulating layer to provide a constant voltage to the covering portion S.

For example, an orthographic projection of the covering portion S overlapping with the active semiconductor layer on a first straight line extending in the first direction overlaps with an orthographic projection of the first connection portion 510 on the first straight line, and an orthographic projection of the fourth connection portion 540 on a second straight line extending in the second direction overlaps with the orthographic projection of the covering portion S on the second straight line. Therefore, in order to keep a distance between the first connection portion 510 and the covering portion S arranged in the same layer, the whole of the first connection portion 510 is arranged in a non-linear shape, such as a zigzag shape.

For example, as illustrated by FIGS. 3A to 3F, the first connection portion 510 includes a main connection portion 511 extending in the first direction and two end portions 512 located at both ends of the main connection portion 511 and extending in the second direction. The two end portions 512 are respectively connected with the two fourth connection portions 540 of the pixel circuit pair 610, and an orthographic projection of the two end portions 512 on the second straight line overlaps with the orthographic projection of the covering portion S on the second straight line. Thereby, the main connection portion and the two end parts form the zigzag shape to keep a distance from the covering portion.

For example, in the second direction, a distance between the covering portion S and the second electrode of the threshold compensation transistor T2 is smaller than a distance between the covering portion S and the first electrode of the first reset transistor T7, that is, the covering portion S is closer to the threshold compensation transistor T2. Therefore, in order to facilitate the design and keep a certain distance between the first connection portion 510 and the covering portion S, the first connection portion 510 is arranged closer to the first electrode of the first reset transistor T7, that is, in the Y direction, the distance between the main connection portion 511 and the second electrode of the threshold compensation transistor T2 in the first pixel circuit 611 is greater than that between the main connection portion 511 and the first electrode of the first reset transistor T7 in the first pixel circuit 611.

Figure 4A:
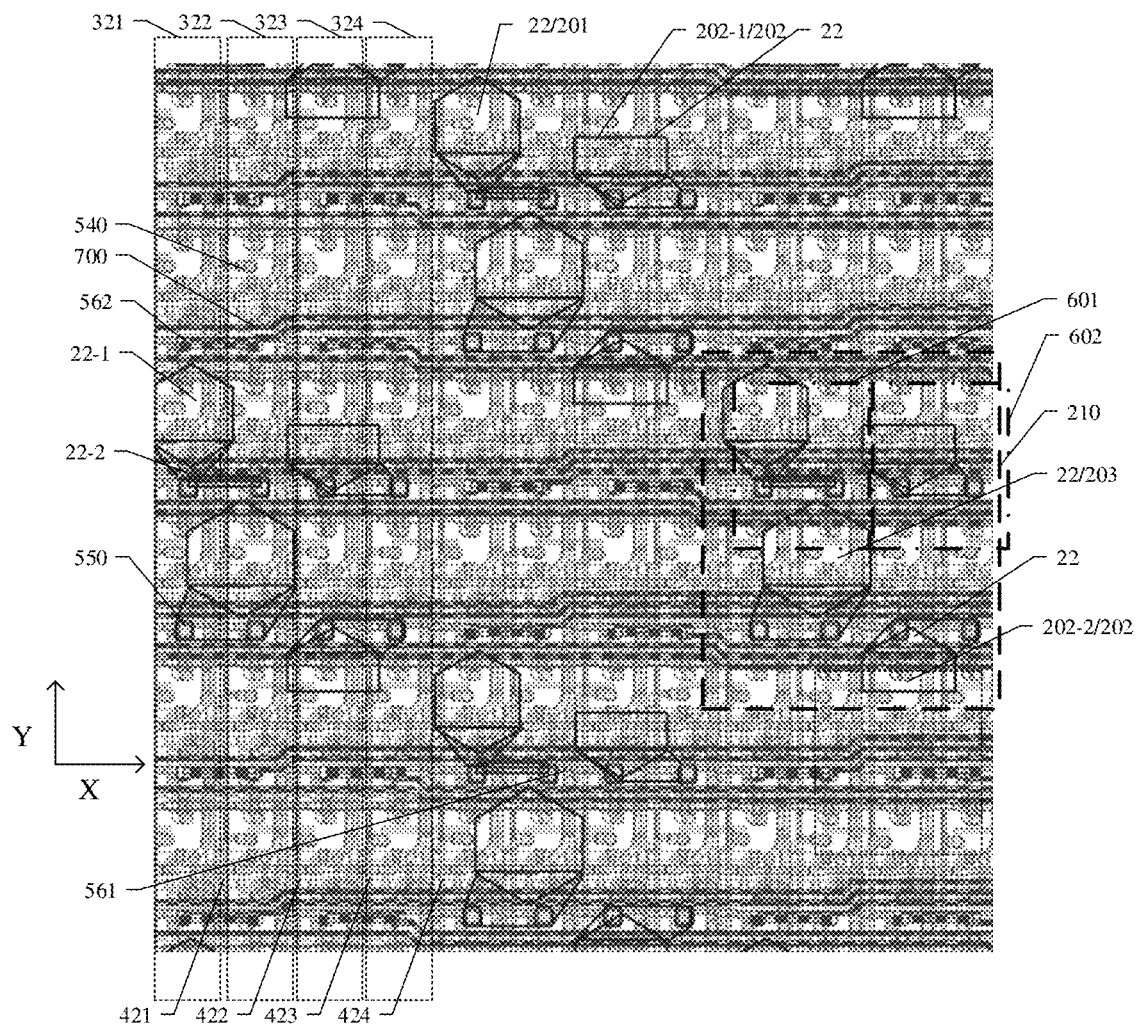
FIG. 4A is a schematic diagram of a connection relationship between a second light emitting unit group and a second pixel circuit group in a second display region according to an embodiment of the present disclosure.
Figure 4B:
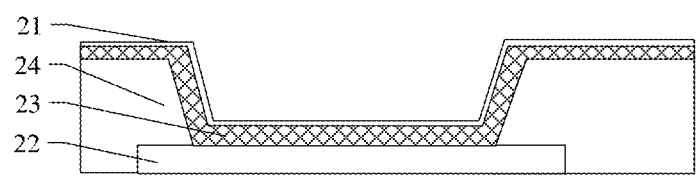
FIG. 4B is a schematic diagram of a layer structure of one light emitting unit in FIG. 4A.

For example, FIG. 4A is a schematic diagram of a connection relationship between a second light emitting unit group and a second pixel circuit group in a second display region according to an embodiment of the present disclosure, and FIG. 4B is a schematic diagram of a layer structure of one light emitting unit in FIG. 4A. As illustrated by FIGS. 1 to 4B, each light emitting unit group includes a plurality of light emitting units 20. For example, each light emitting unit group includes one first color light emitting unit 201, one second color light emitting unit pair 202, and one third color light emitting unit 203, which are arranged in the second direction, and the second color light emitting unit pair 202 includes two second color light emitting units, a first light emitting unit block 202-1 and a second light emitting unit block 202-2, which are arranged in the second direction; the first color light emitting unit 201 and the second color light emitting unit pair 202 are arranged in a first direction. For example, an orthographic projection of the second electrode of the first color light emitting unit 201 on a straight line extending in the Y direction overlaps with an orthographic projection of the second electrode of the first light emitting unit block 202-1 on the straight line; an orthographic projection of the second electrode of the third color light emitting unit 203 on the straight line extending in this direction overlaps with an orthographic projection of an interval between the second electrodes of two second color light emitting units on the straight line. For example, an orthographic projection of the main body electrode (described later) of the third color light emitting unit 203 on a straight line extending in this direction does not overlap with orthographic projections of the main body electrodes of two second color light emitting units on this straight line.

For example, each light emitting unit 20 includes a first electrode 21, a light emitting layer 23, and a second electrode 22 which are sequentially arranged in a direction perpendicular to the base substrate 10, and the second electrode 12 is located at a side of the light emitting layer 13 facing the base substrate 10. The display substrate further includes a pixel defining layer 24, which includes an opening for defining the light emitting region of sub-pixel, which exposes the second electrode 22 of the light emitting unit 20. Upon the light emitting layer 23 of the light emitting unit 20 being subsequently formed in the opening of the pixel defining layer 24, the light emitting layer 23 is in contact with the second electrode 22, so that this part can drive the light emitting layer 23 to emit light to form an effective light emitting region. The "effective light emitting region" here can refer to a two-dimensional planar region, which is parallel to the base substrate. It should be noted that, because of process reasons, a size of a part of the opening of the pixel defining layer away from the base substrate is slightly greater than a size of a part the opening close to the base substrate, or the size gradually increases from the side close to the base substrate to the side away from the base substrate, the size of the effective light emitting region may be slightly different from that of the size of the opening of the pixel defining layer at different positions, but the shape and size of the whole region are basically the same. For example, the orthographic projection of the effective light emitting region on the base substrate is approximately coincident with the orthographic projection of the opening of the corresponding pixel defining layer on the base substrate. For example, the orthographic projection of the effective light emitting region on the base substrate completely falls within the orthographic projection of the opening of the corresponding pixel defining layer on the base substrate, and the shapes of the two are similar. The area of the orthographic projection of the effective light emitting region on the base substrate is slightly smaller than the area of the orthographic projection of the opening of the corresponding pixel defining layer on the base substrate.

For example, the first color light emitting unit may be one of a red light emitting unit and a blue light emitting unit, the third color light emitting unit is the other of the red light emitting unit and the blue light emitting unit, and the second color light emitting unit pair is a green light emitting unit pair. The present disclosure schematically shows that the first color light emitting unit is the red light emitting unit, and the second color light emitting unit is the green light emitting unit.

For example, as illustrated by FIGS. 1 to 4B, each pixel circuit further includes a fifth connection portion 550 arranged in the same layer as the data line 420, and the second electrodes 22 of the light emitting units 20 located in the first display region 100 and the second display region 200 can be directly electrically connected with the second electrodes of the first light emitting control transistors T6 through the fifth connection portions 550. For example, in the first display region 100, the second electrode of each light emitting unit 20 in the first light emitting unit group 110 may be directly electrically connected with the second electrode of the first light emitting control transistor T6 through the fifth connection portion 550 of the corresponding pixel circuit 600 in the first pixel circuit group 120. In the second display region 200, the second electrode of each light emitting unit 20 in the second light emitting unit group 210 can be directly electrically connected with the second electrode of the first light emitting control transistor T6 through the fifth connection portion 550 of the corresponding pixel circuit 600 in the second pixel circuit group 220. For example, in the second display region 200, the second electrode of each light emitting unit 20 in the second light emitting unit group 210 may be connected with the fifth connection portion 550 through the first via hole 561 in the passivation layer and the planarization layer.

For example, as illustrated by FIGS. 1 to 4B, the second pixel circuit group 220 includes a plurality of pixel circuit pairs 610, and the second electrode 22 of each light emitting unit 20 of the second light emitting unit group 210 includes a main body electrode and a connection electrode, the main body electrode has a shape basically the same as that of the effective light emitting region of each light emitting unit 20, and the connection electrode is configured to be directly electrically connected with the fifth connection portion 550 to electrically connect with the second electrodes of the two first light emitting control transistors T6 of the pixel circuit pairs 610.

For example, as illustrated by FIGS. 1 to 4B, the display substrate further includes a plurality of transparent lines 700 located between the second electrode 22 and the film layer where the data line 420 is located, and each of the transparent lines 700 extends in the first direction. For example, the third pixel circuit group 230 includes a plurality of pixel circuit pairs 610, and the transparent line 700 is configured to connect the second electrode 22 of the light emitting unit 20 in the third light emitting unit group 310 and the fifth connection portion 550 to electrically connect the second electrode 22 of each light emitting unit 20 of the third light emitting unit group 310 with the second electrodes of the two first light emitting control transistors T6 of the pixel circuit pair 610 of the third pixel circuit group 230.

For example, in the second display region 200, the transparent line 700 is electrically connected with the fifth connection portion 550 in the third pixel circuit group 310 through the second via hole 562 in the passivation layer and the planarization layer; in the third display region 300, the second electrode 22 of the light emitting unit 20 is connected with the transparent line 700 through a via hole in the third insulating layer between the transparent line 700 and the second electrode 22, thereby realizing the connection with the pixel circuit 600 in the second display region 200.

Figure 4C:
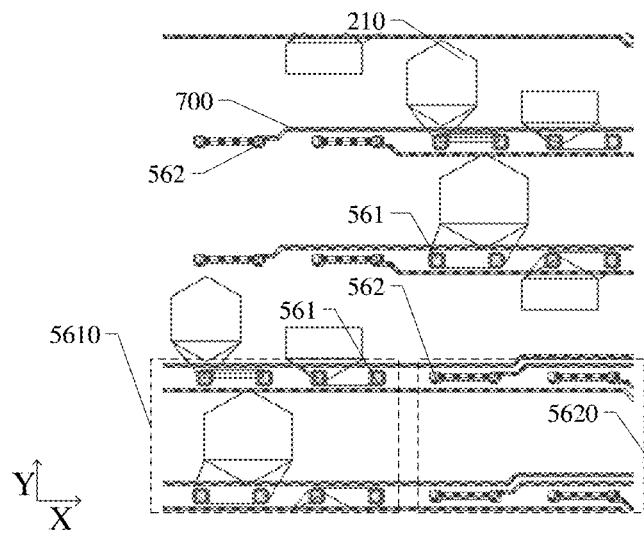
FIG. 4C is a schematic diagram of a position relationship between a second light emitting unit group and a via hole in the second display region shown in FIG. 4A.

For example, FIG. 4C is a schematic diagram of a position relationship between a second light emitting unit group and a via hole in the second display region shown in FIG. 4A. As illustrated by FIGS. 4A and 4C, one first via hole group 5610 composed of a plurality of first via holes 561 connecting one second light emitting unit group 210 and one second pixel circuit group 220, and one second via hole group 5620 composed of a plurality of second via holes 562 connecting one third light emitting unit group 310 and one third pixel circuit group 230. In the first direction, a plurality of first via hole groups 5610 and a plurality of second via hole groups 5620 are alternately arranged; in the second direction, a plurality of first via hole groups 5610 and a plurality of second via hole groups 5620 are alternately arranged. Compared with the situation that the second light emitting unit group and the third light emitting unit group are both connected with the fifth connection portion through the film layer where the transparent line is located, in the embodiment of the present disclosure, the second electrode of the light emitting unit of the second light emitting unit group is directly connected with the fifth connection portion, while the second electrode of the light emitting unit of the third light emitting unit group is connected with the fifth connection portion through the transparent line, so that more space can be reserved for the transparent line to prevent signal crosstalk.

Figure 5A:
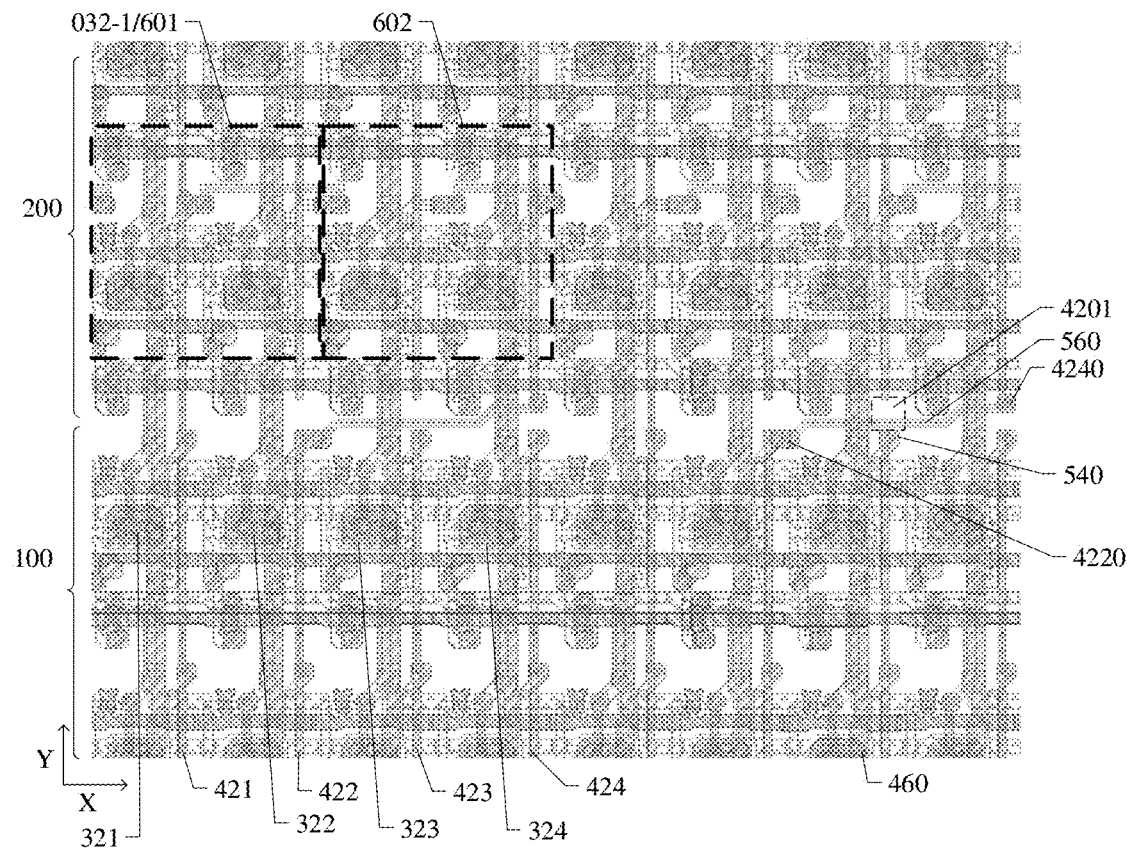
FIG. 5A is a schematic diagram of a partial pixel circuit structure at a junction of a first display region and a second display region according to an embodiment of the present disclosure.
Figure 5B:
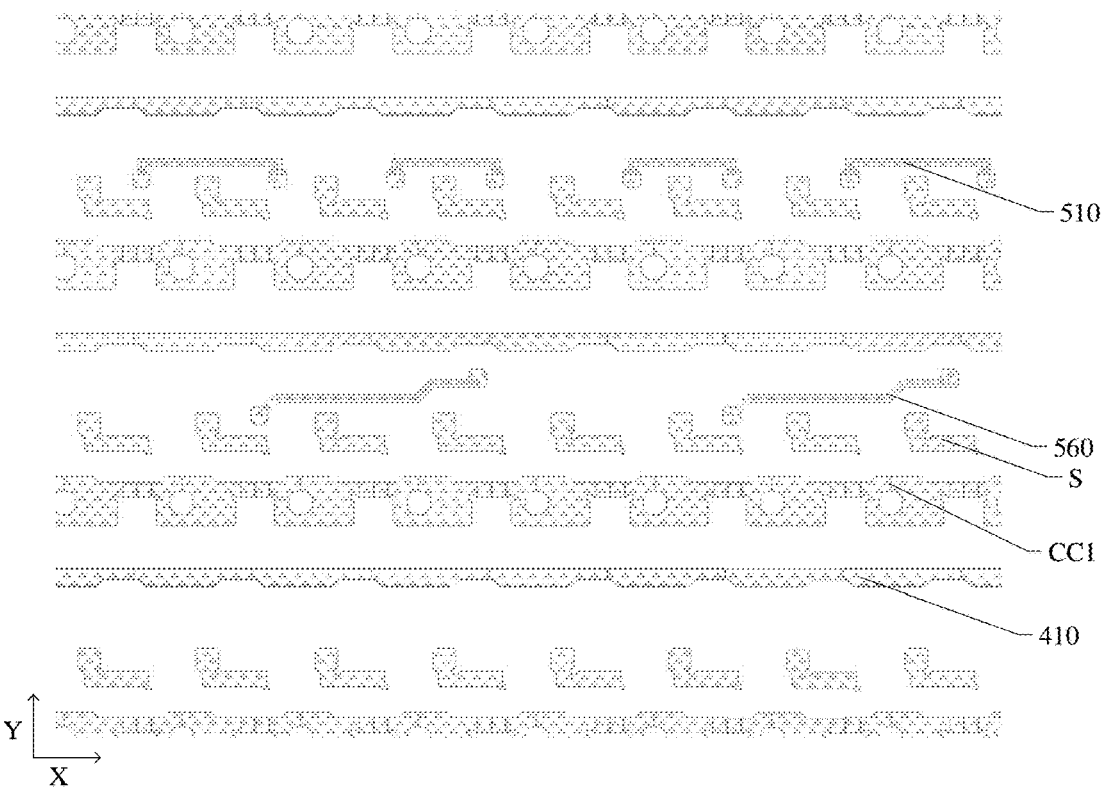
FIG. 5B is a schematic diagram of a film structure where a data line connection portion is located in a position shown in FIG. 5A.
Figure 5C:
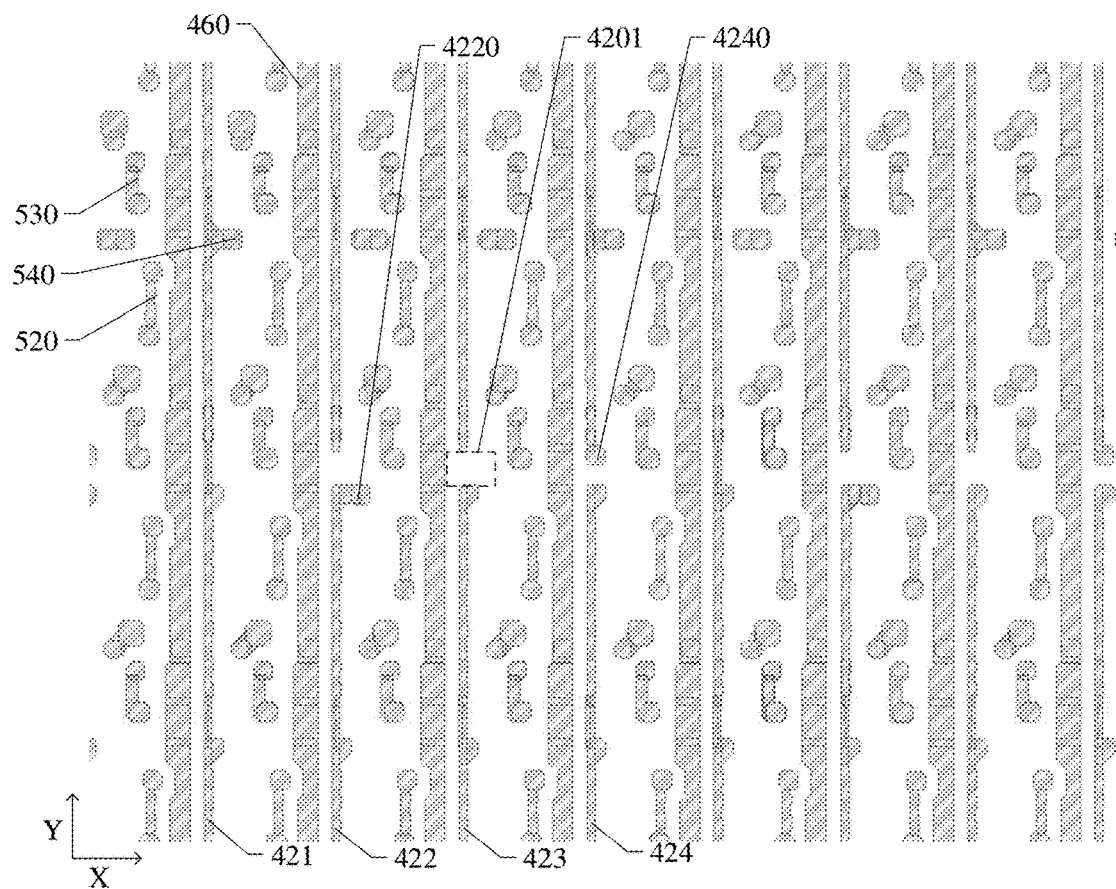
FIG. 5C is a schematic diagram of a film structure where a data line is located in a position shown in FIG. 5A.
Figure 5D:
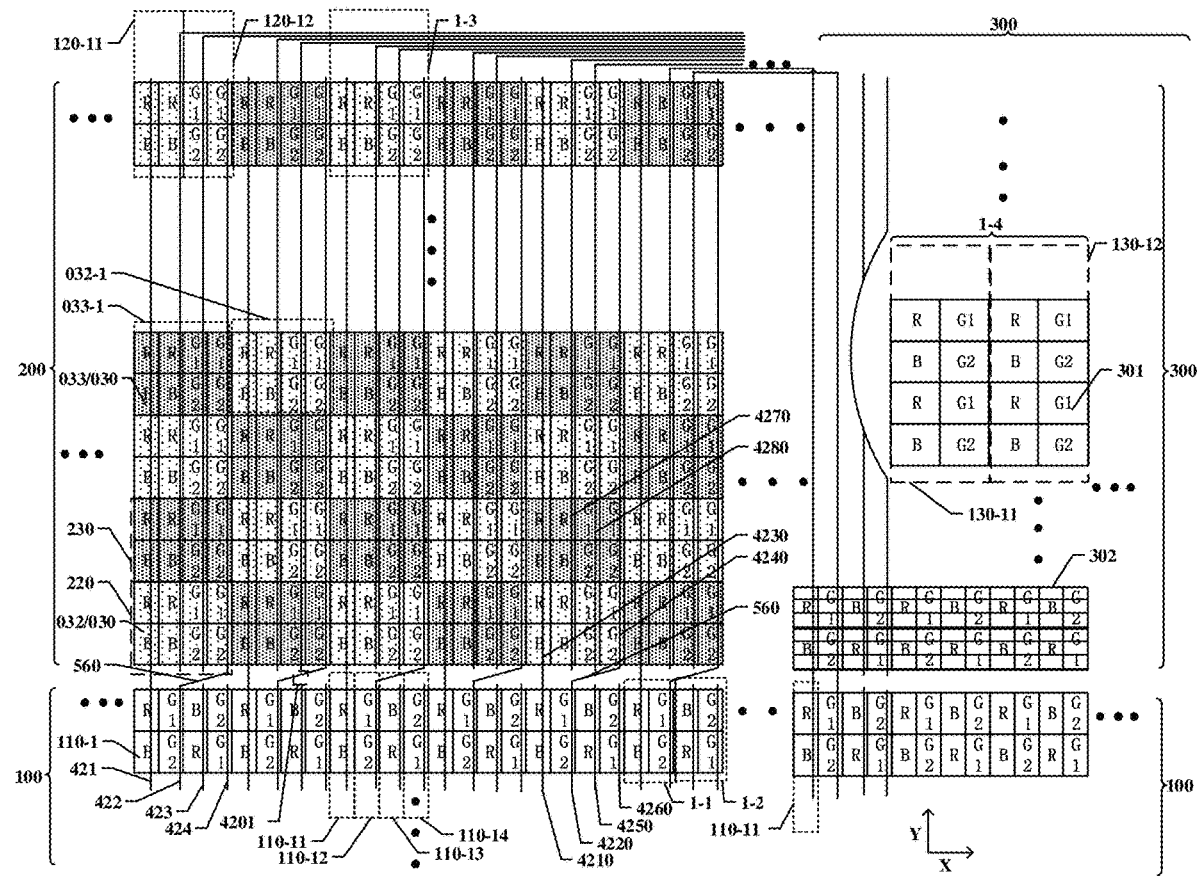
FIG. 5D is a partial plan view of a first display region and a second display region in the display substrate shown in FIG. 1.

For example, FIG. 5D is a partial plan view of a first display region and a second display region in the display substrate shown in FIG. 1. As illustrated by FIGS. 1 and 5D, in an embodiment of the present disclosure, the first display region 100 and the second display region 200 in the display substrate include a plurality of pixel circuits 030 arranged in the first direction and the second direction to form a plurality of pixel circuit columns 32 and a plurality of pixel circuit rows 31. The plurality of pixel circuits 030 located in the first display region 100 include a plurality of first sub-pixel circuits 031, and the plurality of pixel circuits 030 located in the second display region 200 include a plurality of second sub-pixel circuits 032. A plurality of first light emitting units in the first display region 100 (that is, light emitting units of three colors included in the first light emitting unit group 110, such as R, G1, G2 and B shown in the figure) are connected with the plurality of first sub-pixel circuits 031 in one-to-one correspondence. Each second light emitting unit of the second display region 200 (i.e., the light emitting units of three colors included in the second light emitting unit group 210, such as R, G1, G2 and B shown in the figure) is connected with at least two second sub-pixel circuits 032.

For example, as illustrated by FIG. 1, the first display region 100 and the second display region 200 are connected in the Y direction (that is, the extending direction of the data lines). The third display region 300 includes a central region 301 and an edge region 302 surrounding the central region 301, and the edge region 302 of the third display region 300 is connected with the first display region 100 in the Y direction. For example, FIG. 1 schematically shows that the shape of the third display region 300 is rectangular, and the shape of the central region 301 of the third display region 300 is circular, so the edge region 302 is a region located in the rectangle except the circular central region. The embodiment of the present disclosure is not limited thereto, and the shapes of the central region and the edge region of the third display region can be arrange according to the actual product requirements.

For example, as illustrated by FIG. 1, the central region 301 and the edge region 302 of the third display region 300 are both provided with third light emitting unit groups 310, and a plurality of third light emitting unit groups 310 located in the third display region 300 are electrically connected with a plurality of third pixel circuit groups 230 in the second display region 200 through transparent lines 700 to drive the third light emitting unit groups 310 to emit light. The central region 301 of the third display region 300 is only provided with light emitting unit groups, without pixel circuit groups, so that the metal coverage area can be reduced to achieve higher light transmittance, while the edge region 302 of the third display region 300 is provided with light-blocking structures besides the light emitting unit groups, so that the third display region 300 forms a light-transmitting region with a preset shape (i.e., the central region 301). For example, in the embodiment of the present disclosure, the light blocking structure provided in the peripheral region 302 of the third display region 300 may be a plurality of dummy pixel circuit groups 320, the plurality of dummy pixel circuit groups 320 include a part located between the third light emitting unit group 310 and the base substrate, and a part located at the interval between adjacent third light emitting unit groups 310. Each dummy pixel circuit group 320 is not connected with any light emitting unit group, but is only a suspended pixel circuit. For example, the edge region 302 is a ring-shaped wiring region. For example, the data line, scanning signal line, power signal line, reset control line, light emitting control signal line, reset power signal line, etc. connected with the third pixel circuit group are all located in the ring-shaped wiring region.

For example, as illustrated by FIG. 1, the third light emitting unit groups 310 in the third display region 300 can be controlled in a left-right half way, and can be controlled by the third pixel circuit groups 230 respectively in two second display regions 200 which are symmetrical about the center line extending in the Y direction of the third display region 300. For example, the third light emitting unit groups 310 located at a left side of the center line are controlled by the third pixel circuit groups 230 located in the second display region 200 at a left side of the center line, and the third light emitting unit group 310 located at a right side of the center line is controlled by the third pixel circuit group 230 located in the second display region 200 at a right side of the center line. The lines used to drive the light emitting units in the circular central region 301 are arranged in the edge region 302 by a dense arrangement, so that the circular central region 301 as the under-screen display region can have an area as large as possible.

For example, as illustrated by FIG. 1, the first display region 100 and the second display region 200 include a plurality of pixel circuits arranged in a first direction and a second direction to form a plurality of pixel circuit columns 32 and a plurality of pixel circuit rows 31. For example, the edge region 302 of the third display region 300 includes a plurality of dummy pixel circuits 034 arranged in the first direction and the second direction to form a plurality of dummy pixel circuit columns and a plurality of dummy pixel circuit rows. Herein, the dummy pixel circuit in the third display region 300 is also referred to as a pixel circuit. Although the dummy pixel circuit is not connected with any light emitting unit, its structure can be roughly the same as that of pixel circuits in other regions, for example, the dummy pixel circuits all include 7T1C (i.e., seven transistors and one capacitor) structure. For example, a plurality of data lines 420 extending in the Y direction are respectively connected with a plurality of pixel circuit columns 32.

For example, as illustrated by FIGS. 1 to 4A, pixel circuit columns 32 include a pixel circuit column group composed of four adjacent columns of the pixel circuit columns, and each pixel circuit column group includes a first pixel circuit column 321, a second pixel circuit column 322, a third pixel circuit column 323, and a fourth pixel circuit column 324 which are sequentially arranged along the X direction (i.e., the direction intersecting the extending direction of the data line 420). The first pixel circuit column 321, the second pixel circuit column 322, the third pixel circuit column 323, and the fourth pixel circuit column 324 in the first display region 100 are connected with the first data line 421, the second data line 422, the third data line 423, and the fourth data line 424 which are sequentially arranged along the X direction, respectively. At least part pixel circuits in the first pixel circuit column 321, at least part pixel circuits in the second pixel circuit column 322, at least part pixel circuits in the third pixel circuit column 323, and at least part pixel circuits in the fourth pixel circuit column 324 in the second display region 200 are connected with the first data line 421, the second data line 422, the third data line 423, and the fourth data line 424 which are sequentially arranged along the X direction, respectively.

For example, as illustrated by FIGS. 1 to 4A, in the second display region 200, in at least one pixel circuit column group, the data output terminals (i.e., the fourth connection portion 540) of two pixel circuits located in the same pixel circuit row 31 and the first pixel circuit column 321 and the second pixel circuit column 322 are electrically connected to form a first pixel circuit pair 601, the data output terminals (i.e., the fourth connection portion 540) of two pixel circuits 600 located in the same pixel circuit row 31 and the third pixel circuit column 323 and the fourth pixel circuit column 324 are electrically connected to form a second pixel circuit pair 602. The embodiment of the present disclosure schematically shows that each pixel circuit column group in the second display region includes a first pixel circuit pair and a second pixel circuit pair, but is not limited thereto, and can be arrange according to actual product requirements.

For example, as illustrated by FIGS. 1 to 4A, the first display region 100, the second display region 200 and the third display region 300 each includes a plurality of light emitting units 20, and the plurality of light emitting units 20 in the first display region 100 are respectively connected with a plurality of pixel circuits 600 in the first display region 100. The light emitting units 20 of the second display region 200 are respectively connected with a part of the pixel circuits 600 of the second display region 200, and the light emitting units 20 of the third display region 300 are respectively connected with another part of the pixel circuits 600 of the second display region 200. That is, in the second display region 200, the light emitting units 20 in the second light emitting unit group 210 are connected with the pixel circuits 600 in the second pixel circuit group 220; the light emitting units 20 in the third light emitting unit group 310 in the third display region 300 are connected with the pixel circuits 600 in the third pixel circuit group 230 in the second display region 200. The embodiment of the present disclosure schematically shows that the second display region only includes the second pixel circuit group and the third pixel circuit group, but it is not limited thereto. According to factors such as space design requirements in products, the second display region may also include other pixel circuit groups, such as dummy pixel circuit groups (which are not connected with light emitting units).

For example, as illustrated by FIGS. 1 to 4A, the second pixel circuit group 220 and the third pixel circuit group 230 in the second display region 200 both include a first pixel circuit pair 601 and a second pixel circuit pair 602, and in the second display region 200 and the third display region 300, a plurality of light emitting units 20 are connected with a plurality of first pixel circuit pairs 601 and a plurality of second pixel circuit pairs 602 in the second display region 200, respectively.

For example, in the embodiment of the present disclosure, the light emitting unit arranged in the first display region may be called the first light emitting unit, the light emitting unit arranged in the second display region may be called the second light emitting unit, and the light emitting unit arranged in the third display region may be called the third light emitting unit.

The second pixel circuit groups 220 and the third pixel circuit groups 230 are alternately arranged in both the X direction and the Y direction, the second pixel circuit groups 220 and the third pixel circuit groups 230 arranged in the same column along the Y direction are connected with different data lines 420. Therefore, some pixel circuits in the first pixel circuit column 321 in the second display region 200 are connected with the first data line 421; for example, the pixel circuits in the second pixel circuit group 220 of the first pixel circuit column 321 are connected with the first data line 421, while the pixel circuits in the third pixel circuit group 230 of the first pixel circuit column 321 are not connected with the first data line 421. Similarly, some pixel circuits in the second pixel circuit column 322 in the second display region 200 are connected with the second data line 422; for example, the pixel circuits in the third pixel circuit group 230 of the second pixel circuit column 322 are connected with the second data line 422, while the pixel circuits in the second pixel circuit group 220 of the second pixel circuit column 322 are not connected with the second data line 422. Some pixel circuits of the pixel circuits in the third pixel circuit column 323 in the second display region 200 are connected with the third data line 423; for example, the pixel circuits in the third pixel circuit group 230 of the third pixel circuit column 323 are connected with the third data line 423, while the pixel circuits in the second pixel circuit group 220 of the third pixel circuit column 323 are not connected with the third data line 423. Some pixel circuits in the fourth pixel circuit column 324 in the second display region 200 are connected with the fourth data line 424; for example, the pixel circuits in the second pixel circuit group 220 of the fourth pixel circuit column 324 are connected with the fourth data line 422, while the pixel circuits in the third pixel circuit group 230 of the fourth pixel circuit column 324 are not connected with the fourth data line 424.

For example, as illustrated by FIGS. 1 to 4A, a plurality of first pixel circuit pairs 601 connected with a plurality of light emitting units 20 in the second display region 200 are connected with the first data line 421, a plurality of second pixel circuit pairs 602 connected with a plurality of light emitting units 20 in the second display region 200 are connected with the fourth data line 424, a plurality of first pixel circuit pairs 601 connected with a plurality of light emitting units 20 in the third display region 300 are connected with the second data line 422, a plurality of second pixel circuit pairs 602 connected with a plurality of light emitting units 20 in the third display region 300 are connected with the third data line 423.

For example, in the second pixel circuit group 220, two pixel circuits in the first pixel circuit pair 601 are connected with the first data line 421, and two pixel circuits in the second pixel circuit pair 602 are connected with the fourth data line 424. In the third pixel circuit group 230, two pixel circuits in the first pixel circuit pair 601 are connected with the second data line 422, and two pixel circuits in the second pixel circuit pair 602 are connected with the third data line 423.

For example, as illustrated by FIGS. 1 to 4A, the first pixel circuit pair 601 connected with the first color light emitting unit 201 and the third color light emitting unit 203 in the second light emitting unit group 210 is connected with the first data line 421, and the second pixel circuit pair 602 connected with the second color light emitting unit pair 202 in the second light emitting unit group 210 is connected with the fourth data line 424.

FIG. 5A is a schematic diagram of a part of pixel circuit structure at the junction of the first display region and the second display region according to the embodiment of the present disclosure; FIG. 5B is a schematic diagram of the film structure of the data line connection portion in the position shown in FIG. 5A; and FIG. 5C is a schematic diagram of a film structure of the data line in the position shown in FIG. 5A. As illustrated by FIGS. 1 to 5D, at the junction of the first display region 100 and the second display region 200, i.e., at the interval between the first sub-pixel circuit 031 and the second sub-pixel circuit 032, the second data line 422, the third data line 423 and the fourth data line 424 connected with at least one pixel circuit column group are disconnected to form a first break 4201, and the first data line 421 remains continuous without a break. That is, the part of the second data line 422 located in the second display region 200 and the part of the second data line 422 located in the first display region 100 are not connected at the junction of the first display region 100 and the second display region 200. Similarly, the part of the third data line 423 located in the second display region 200 is not connected with the part of the third data line 423 located in the first display region 100 at the junction of the first display region 100 and the second display region 200. The part of the fourth data line 424 located in the second display region 200 is not connected with the part of the fourth data line 424 located in the first display region 100 at the junction of the first display region 100 and the second display region 200. An end point 4220 of the second data line 422 located in the first display region 100 close to the second display region 200 is connected with an end point 4240 of the fourth data line 424 located in the second display region 200 close to the first display region 100 through the data line connection portion 560, which passes through the first break 4201 of the third data line 423. Herein, the first data line 421, the second data line 422, the third data line 423 and the fourth data line 424 can refer to a continuous data line, for example, the first data line 421 is a continuous data line; the first data line 421, the second data line 422, the third data line 423 and the fourth data line 424 can also refer to discontinuous data lines connected with the same column of pixel circuits, such as the second data line 422, the third data line 423 and the fourth data line 424, whereby the second data line 422 connected with the first sub-pixel circuit and the second data line 422 connected with the second sub-pixel circuit are configured to transmit different signals; the third data line 423 connected with the first sub-pixel circuit and the third data line 423 connected with the second sub-pixel circuit are configured to transmit different signals; the fourth data line 424 connected with the first sub-pixel circuit and the fourth data line 424 connected with the second sub-pixel circuit are configured to transmit different signals.

For example, the second data line 422 connected with the first sub-pixel circuit 031 and the second data line 422 connected with the second sub-pixel circuit 032 are configured to transmit different signals; the third data line 423 connected with the first sub-pixel circuit 031 and the third data line 423 connected with the second sub-pixel circuit 032 are configured to transmit different signals; the fourth data line 424 connected with the first sub-pixel circuit 031 and the fourth data line 424 connected with the second sub-pixel circuit 032 are configured to transmit different signals. Although the data lines located in the same lines in the first display region and the second display region are respectively referred to as the second data line, the third data line or the fourth data line in the present application, the second data lines (the third data lines or the fourth data lines) located in different display regions are configured to transmit different signals.

For example, the embodiment of the present disclosure schematically shows that the end point of the second data line, in the first display region, close to the second display region is connected with the end point of the fourth data line, in the second display region, close to the first display region through the data line connection portion, but it is not limited thereto, and the end point of the second data line, in the first display region, close to the second display region can also be connected with the end point of the third data line, in the second display region, close to the first display region through the data line connection portion.

In the embodiment of the present disclosure, the pixel circuit located in the first display region is called the first sub-pixel circuit, the pixel circuit connected with the light emitting unit located in the second display region is called the second sub-pixel circuit, and the pixel circuit connected with the light emitting unit located in the third display region is called the third sub-pixel circuit.

For example, as illustrated by FIG. 5A, the present disclosure takes a case that, light emitting units 20 connected with the first pixel circuit column 321 in the first display region 100 include a first color light emitting unit and a third color light emitting unit, and light emitting units 20 connected with the second pixel circuit column 322 in the first display region 100 include a second color light emitting unit pair, light emitting units 20 connected with the third pixel circuit column 323 in the first display region 100 include the first color light emitting unit and the third color light emitting unit, and the light emitting units 20 connected with the fourth pixel circuit column 324 in the first display region 100 include the second color light emitting unit pair, as an example.

In the embodiment of the present disclosure, the data signal is transmitted from the source driver IC located at a side of the first display region away from the second display region to the pixel circuits in the first display region and the second display region through the data line, and the data signal transmitted to the pixel circuit connected with one color light emitting unit in the second display region should be the same as the data signal transmitted to the pixel circuit connected with the same color light emitting unit in the first display region. Therefore, upon the same pixel circuit column in the first display region being connected with the same data line, and the pixel circuit pair in the second display region being connected with the same data line, a problem that the data signal transmitted to the pixel circuit connected with the first color light emitting unit in the first display region is the same as the data signal transmitted to the pixel circuit pair connected with the second color light emitting unit pair in the second display region, thereby resulting in data signal mismatch between the first display region and the second display region.

For example, in the first display region 100, each first light emitting unit group 110 includes one first color light emitting unit, one second color light emitting unit pair and one third color light emitting unit, and each second color light emitting unit pair includes a first light emitting unit block and a second light emitting unit block. The first color light emitting units and the third color light emitting units are arranged in a direction (Y direction) parallel to the extending direction of the data line, the first light emitting unit block and the second light emitting unit block are arranged in the Y direction, the first color light emitting unit and the second color light emitting unit pair are arranged in the X direction intersecting with the Y direction, and the directions of the first color light emitting units pointing to the third color light emitting units in two adjacent first light emitting unit groups are opposite. That is, the light emitting units connected with four pixel circuits in one row of pixel circuits close to the second display region in the first display region and located in the pixel circuit column group are the first color light emitting unit, the first light emitting unit block, the third color light emitting unit and the second light emitting unit block in turn. And the four light emitting units connected with the second row of pixel circuits located in the first display region close to the second display region in the pixel circuit column group are the third color light emitting unit, the second light emitting unit block, the first color light emitting unit and the first light emitting unit block in turn. Therefore, the arrangement of the first color light emitting units and the third color light emitting units connected with the pixel circuits of the first pixel circuit column is different from that of the first color light emitting units and the third color light emitting units connected with the pixel circuits of the third pixel circuit column; the arrangement of the first light emitting unit blocks and the second light emitting unit blocks connected with the pixel circuits of the second pixel circuit column is different from that of the first light emitting unit blocks and the second light emitting unit blocks connected with the pixel circuits of the fourth pixel circuit column. The data signals transmitted by the data lines are related to the arrangement of the corresponding color light emitting units, and the first display region and the second display region should transmit the matched data signals according to the arrangement of the light emitting units.

For example, as illustrated by FIGS. 1 to 5A, a plurality of light emitting units 20 connected with the first pixel circuit column 321 in the second display region 200 include first color light emitting units 201 and third color light emitting units 203 that are alternately arranged, and the light emitting unit connected with the pixel circuits located in one row of the second display region 200 close to the first display region 100, and located in the first pixel circuit column 321 is, for example, the third color light emitting unit 203. The plurality of light emitting units 20 connected with the first pixel circuit column 321 in the first display region 100 include the first color light emitting units and the third color light emitting units which are alternately arranged, and the light emitting unit connected with the pixel circuits located in one row of the first display region 100 close to the second display region 200 and located in the first pixel circuit column 321 is the first color light emitting unit. Therefore, the pixel circuit connected with the first data line in one row of pixel circuits close to the second display region in the first display region is connected with the first color light emitting unit, and the pixel circuit connected with the same first data line in one row of pixel circuits close to the first display region in the second display region is connected with the third color light emitting unit, and the arrangement of the light emitting units is matched with the data signal transmitted by the first data line, so that the first data line can be continuous at the junction of the first display region and the second display region without being disconnected at the junction of the two display regions.

For example, as illustrated by FIGS. 1 to 5A, a plurality of second color light emitting unit pairs 202 connected with the fourth pixel circuit column 324 in the second display region 200 include first light emitting unit blocks 202-1 and second light emitting unit blocks 202-2 which are alternately arranged, and the light emitting unit connected with the pixel circuit of the fourth pixel circuit column 324 located in one row close to the first display region 100 in the second display region 200 is, for example, the second light emitting unit blocks 202-2. In the first display region 100, a plurality of second color light emitting unit pairs connected with the fourth pixel circuit column 324 include first light emitting unit blocks and second light emitting unit blocks arranged alternately, and the light emitting unit connected with the pixel circuit of the fourth pixel circuit column 324 located in one row close to the second display region 200 in the first display region 100 is also the second light emitting unit block. Therefore, the light emitting unit connected with the pixel circuit of the fourth pixel circuit column located in one row close to the first display region in the second display region is the same kind of the light emitting unit connected with the pixel circuit of the fourth pixel circuit column located in one row close to the second display region in the first display region, the data signals of the fourth data line connected with the fourth pixel circuit column of the first display region and the fourth data line connected with the fourth pixel circuit column of the second display region do not match, so that the fourth data line should break at the junction of the first display region and the second display region.

For example, as illustrated by FIGS. 1 to 5A, a plurality of second color light emitting unit pairs connected with the second pixel circuit column 322 in the first display region 100 include first light emitting unit blocks and second light emitting unit blocks arranged alternately, and the light emitting unit connected with the pixel circuit located in one row of the first display region 100 close to the second display region 200 and located at the second pixel circuit column 322 is the first light emitting unit block. Therefore, the data signal of the fourth data line connected with the fourth pixel circuit column of the second display region matches the data signal of the second data line connected with the second pixel circuit column of the first display region, the part of the second data line located in the first display region is disconnected from the part of the second data line located in the second display region at the junction of the two display regions, and the second data line located in the first display region is connected with the fourth data line located in the second display region through the data line connection portion, so that the integrated circuit (IC) can meet the requirements of the first display region and the second display region.

In the embodiment of the present disclosure, the second data line, the third data line and the fourth data line are disconnected at the junction of the first display region and the second display region, and the end point of the second data line located in the first display region close to the second display region and the end point of the fourth data line located in the second display region close to the first display region are connected by the data line connection portion, so that the data signal transmitted from the data line to the light emitting unit in the first display region can be matched with the data signal transmitted from the data line to the light emitting unit in the second display region.

For example, as illustrated by FIGS. 5A to 5C, the data line connection portion 560 and the plurality of data lines 420 are located in different layers. For example, in the direction perpendicular to the base substrate, the data line connection portion 560 overlaps with the power signal line 460. Because the data line connection portion needs to pass through the first break of the third data line and two power signal lines to connect the end point of the second data line and the end point of the fourth data line, the data line connection portion needs to be arranged in a different layer from the data line.

For example, as illustrated by FIGS. 5A to 5C, the data line connection portion 560 is located at the same layer as the reset power signal line 410 to facilitate the design.

For example, as illustrated by FIGS. 5A to 5C, the data line connection portion 560 is arranged between the second electrodes of the threshold compensation transistors T2 and the first electrodes of the first reset transistors T7 in two pixel circuits respectively located in the third pixel circuit column 323 and the fourth pixel circuit column 324, and located in one first pixel circuit row 31, in the first display region 100, adjacent to the second display region 200.

In the embodiment of the present disclosure, the junction of the first display region 100 and the second display region 200 refers to an interval between the first electrode of the first reset transistor and the second electrode of the data write transistor of the pixel circuit in one pixel circuit row 31, in the first display region 100, adjacent to the second display region 200.

For example, in the pixel circuit row 31 in the first display region 100 which is adjacent to the second display region 200, a distance between the second electrode of the threshold compensation transistor T2 and the first electrode of the first reset transistor T7 in the second direction is 7-12 microns to arrange the data line connection portion 560 between the second electrode of the threshold compensation transistor T2 and the first electrode of the first reset transistor T7.

For example, in the pixel circuit in the first display region 100, a distance between the edges of the second connection portion 520 and the third connection portion 530 which are adjacent to each other in the second direction is 7-12 microns to arrange the data line connection portion 560 between the second connection portion 520 and the third connection portion 530. In the embodiment of the present disclosure, although the first connection portion and the data line connection portion are respectively arranged in the second display region and the junction of the first display region and the second display region, by adjusting the distance between the second electrode of the threshold compensation transistor and the first electrode of the first reset transistor of the pixel circuit, both the first connection portion and the data line connection portion can be arranged in the reserved larger space between the second electrode of the threshold compensation transistor and the first electrode of the first reset transistor of the pixel circuit to prevent interference with other signals.

Figure 6:
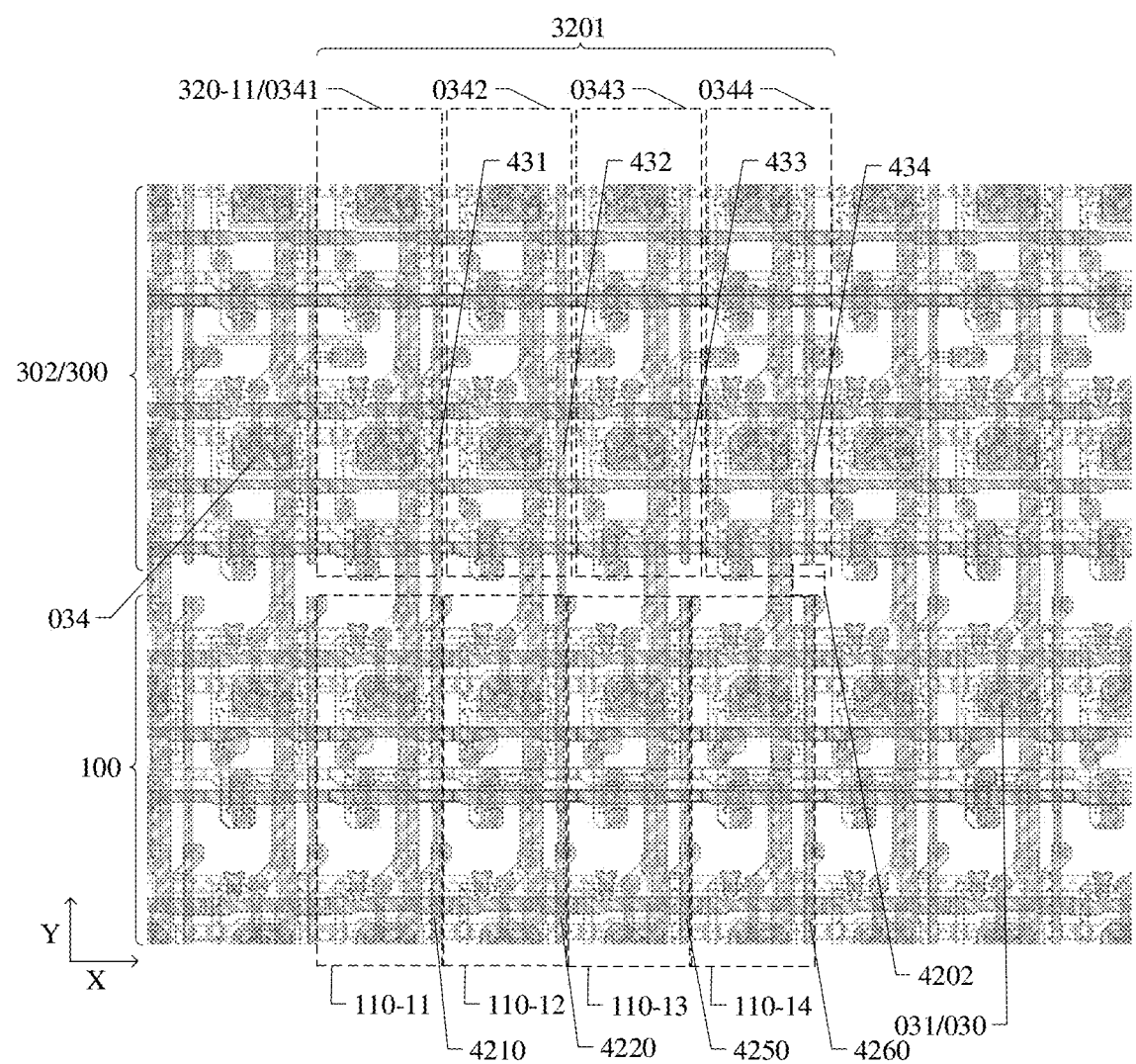
FIG. 6 is a schematic diagram of a partial pixel circuit structure at a junction of a first display region and a third display region according to an embodiment of the present disclosure.

For example, FIG. 6 is a schematic diagram of a partial pixel circuit structure at a junction of the first display region and the third display region according to an embodiment of the present disclosure. For example, as illustrated by FIG. 6, a plurality of dummy pixel circuit columns in the third display region include dummy pixel circuit column groups composed of four adjacent columns, and each dummy pixel circuit column group includes a first dummy pixel circuit column 0341, a second dummy pixel circuit column 0342, a third dummy pixel circuit column 0343 and a fourth dummy pixel circuit column 0344 which are sequentially arranged in the second direction. At least part dummy pixel circuits 034 of the first dummy pixel circuit column 0341, at least part dummy pixel circuits 034 of the second dummy pixel circuit column 0342, at least part dummy pixel circuits 034 of the third dummy pixel circuit column 0343 and at least part dummy pixel circuits 034 of the fourth dummy pixel circuit column 0344 are connected with the first data line 421, the second data line 422, the third data line 423 and the fourth data line 424 which are sequentially arranged along the second direction, and at the interval between the dummy pixel circuit 034 and the first pixel circuit 031 (for example, the junction of the edge region 302 of the third display region 300 and the first display region 100), the third data line 423 and the fourth data line 424 are disconnected to form a second break 4202.

For example, the above-mentioned first dummy pixel circuit column 0341, the second dummy pixel circuit column 0342, the third dummy pixel circuit column 0343 and the fourth dummy pixel circuit column 0344 may also be referred to as the first pixel circuit column, the second pixel circuit column, the third pixel circuit column and the fourth pixel circuit column, respectively.

For example, as illustrated by FIGS. 1 to 6, the pixel circuit pair connected with the first color light emitting unit and the third color light emitting unit in the third light emitting unit group 310 may be one of the first pixel circuit pair 601 and the second pixel circuit pair 602, and the pixel circuit pair connected with the second color light emitting unit pair in the third light emitting unit group 310 may be the other of the first pixel circuit pair 601 and the second pixel circuit pair 602.

For example, the pixel circuit pair connected with the first color light emitting unit and the third color light emitting unit of the third light emitting unit group 310 may be connected with one of the second data line 422 and the third data line 423, and pixel circuit pair connected with the first light emitting unit block and the second light emitting unit block of the third light emitting unit group 310 may be connected with the other of the second data line 422 and the third data line 423. For example, the pixel circuit pair connected with the first color light emitting unit and the third color light emitting unit of the third light emitting unit group 310 may be connected with the third data line 423, and the pixel circuit pair connected with the first light emitting unit block and the second light emitting unit block of the third light emitting unit group 310 may be connected with the second data line 422. Because both the second data line and the third data line are disconnected at the junction of the first display region and the second display region, the pixel circuit connected with the third light emitting unit group cannot be input with the matched data signal by the data line in the first display region connected with the second display region. In the embodiment of the present disclosure, the first data line which is continuous at the junction of the third display region and the first display region is used to connect the pixel circuit pairs connected with the first light emitting unit block and the second light emitting unit block of the third light emitting unit group 310, and the second data line which is continuous at the junction of the third display region and the first display region is used to connect the pixel circuit pairs connected with the first color light emitting unit and the third light emitting unit of the third light emitting unit group 310, so as to realize the input of matched data signals to the pixel circuits connected with the third light emitting unit group, and meet the requirements of integrated circuits in the first display region and the third display region.

For example, the plurality of light emitting units, connected with the third pixel circuit column 323 of the second display region 200, in the third display region 300 include the first color light emitting units and the third color light emitting units arranged alternately, and the light emitting units connected with the pixel circuits located in the first row of the second display region 200 away from the first display region 100 and being the third pixel circuit column 323 are the third color light emitting units. The plurality of light emitting units 20, connected with the first pixel circuit column 321, in the first display region 100 include the first color light emitting units and the third color light emitting units which are alternately arranged, and the data lines connected with the pixel circuits of the first color light emitting units located in one row of the third display region 300 close to the first display region 100 are the first data lines.

For example, the plurality of light emitting units, connected with the second pixel circuit column 322 of the second display region 200, in the third display region 300 include the first light emitting unit blocks and the second light emitting unit blocks arranged alternately, and the light emitting units connected with the pixel circuits located in the first row of the second display region 200 away from the first display region 100 and being the second pixel circuit column 322 are the second light emitting unit blocks. The plurality of light emitting units 20, connected with the second pixel circuit column 322, in the first display region 100 include the first light emitting unit blocks and the second light emitting unit blocks arranged alternately, and the data lines connected with the pixel circuits which are connected with the first light emitting unit blocks of the third display region 300 close to the first display region 100 are the second data lines. Therefore, the data signal on the first data line in the region where the first display region meets the edge region of the third display region matches the data signal on the third data line in the second display region, and the data signal on the second data line in the region where the first display region meets the edge region of the third display region matches the data signal on the second data line in the second display region, while the data signals transmitted by the third data line and the fourth data line in the region where the first display region meets the edge region of the third display region do not match the data signals on the third data line and the second data line in the second display region, so that, at the junction of the edge region of the third display region and the first display region, the first data line and the second data line keep being connected, and the third data line and the fourth data line are broken.

For example, as illustrated by FIGS. 1 to 6, the display substrate further includes a peripheral region 303 located at a side of the third display region 300 away from the first display region 100, a first data line 421 located at the edge region 302 of the third display region 300 bypasses the central region 301 to be connected with one of the second data line 422 and the third data line 423 of the second display region 200 at the peripheral region 303, and a second data line 422 located at the edge region 302 of the third display region 300 bypasses the central region 301 to be connected with the other of the second data line 422 and the third data line 423 of the second display region 200 at the peripheral region 303.

For example, the embodiment of the present disclosure schematically shows that the first data line 421 located in the edge region 302 of the third display region 300 bypasses the central region 301 to be connected with the third data line 423 of the second display region 200 in the peripheral region 303, and the second data line 422 located in the edge region 302 of the third display region 300 bypasses the central region 301 to be connected with the second data line 422 of the second display region 200 in the peripheral region 303, which is convenient for the wiring of the data lines in the third display region and the second display region.

For example, as illustrated by FIGS. 1-6, another embodiment of the present disclosure provides a display substrate including a first display region 100 and a second display region 200. The first display region 100 includes a plurality of first light emitting units 110-1 and a plurality of first sub-pixel circuits 031. The first light emitting units 110-1 include a first light emitting unit column 110-11 and a second light emitting unit column 110-12 which are arranged adjacent to each other. Each light emitting unit column is connected with one corresponding column of first sub-pixel circuits 031. The second display region 120 includes a plurality of second light emitting units 120-1 and a plurality of second sub-pixel circuits 032, the plurality of second light emitting units 120-1 include a third light emitting unit column 120-11 and a fourth light emitting unit column 120-12 which are arranged adjacent to each other. Each light emitting unit column in the second display region 200 is connected with one first sub-pixel circuit pair 032-1, and each first sub-pixel circuit pair 032-1 includes two adjacent second sub-pixel circuits 032.

For example, as illustrated by FIGS. 1-6, the display substrate further includes a plurality of first sub data lines 4210, a plurality of second sub data lines 4220, a plurality of third sub data lines 4230, and a plurality of fourth sub data lines 4240 which extend in the second direction. Each first sub data line 4210 is connected with each first light emitting unit column 110-11, and each second sub data line 4220 is connected with each second light emitting unit column 110-12, each third sub data line 4230 is connected with each third light emitting unit column 120-11, and each fourth sub data line 4240 is connected with each fourth light emitting unit column 120-12, and the second direction intersects with the first direction.

For example, as illustrated by FIGS. 1-6, the arrangement direction of the first light emitting unit column 110-11 and the second light emitting unit column 110-12 is the same as the arrangement direction of the third light emitting unit column 120-11 and the fourth light emitting unit columns 120-12; one column of first sub-pixel circuits 031 connected with the first light emitting unit column 110-11 and one column of second sub-pixel circuits 032 connected the third light emitting unit column 120-11 are located in the same column; the first sub data line 4210 and the third sub data line 4230 are one data line continuously extending in the second direction; two columns of second sub-pixel circuits 032 connected with the fourth light emitting unit column 120-12 and one column of first sub-pixel circuits 031 connected with the second light emitting unit column 110-12 are located in different columns, and the second sub data line 4220 and the fourth sub data line 4240 are connected by a data line connection portion 560, and the extending direction of the data line connection portion 560 intersects the second direction.

The first sub data line 4210, the second sub data line 4220, the third sub data line 4230, and the fourth sub data line 4240 here are different from the first data line 421, the second data line 422, the third data line 423, and the fourth data line 424 in the above-mentioned embodiment. The first sub data line 4210 here only refers to the data line connecting the pixel circuits in the first display region among the first data line 421 in the above-mentioned embodiment. Here, the second sub data line 4220 refers to the data line connected with the pixel circuit in the first display region among the second data line 422 in the above embodiment, the third sub data line 4230 only refers to the data line connected with the pixel circuit in the second display region among the first data line 421 in the above embodiment, and the fourth sub data line 4240 only refers to the data line connected with the pixel circuit in the second display region among the fourth data line 424 in the above embodiment.

At the junction of the pixel circuit of the first display region and the pixel circuit of the second display region, the second sub data line and the fourth sub data line are disconnected, and the second sub data line and the fourth sub data line are connected by a data line connection portion, so that the data signal transmitted from the data line to the light emitting unit in the first display region can be matched with the data signal transmitted from the data line to the light emitting unit in the second display region.

For example, as illustrated by FIGS. 1-6, one column of first sub-pixel circuits 031 connected with the second light emitting unit column 110-12 and another column of second sub-pixel circuits 032 connected with the third light emitting unit column 120-11 are located in the same column.

For example, as illustrated by FIGS. 1-6, the first display region 100 further includes a fifth light emitting unit column 110-13 and a sixth light emitting unit column 110-14 which are arranged adjacent to each other. The first light emitting unit column 110-11, the second light emitting unit column 110-12, the fifth light emitting unit column 110-13 and the sixth light emitting unit column 110-14 are repeatedly arranged along the first direction, and the third light emitting unit column 110-13 and the fourth light emitting unit column 110-14 are alternately arranged along the first direction.

For example, as illustrated by FIGS. 1-6, the display substrate further includes a plurality of fifth sub data lines 4250 and a plurality of sixth sub data lines 4260 which extend in the second direction. Each of the fifth sub data lines 4250 is connected with each fifth light emitting unit column 110-13, and each of the sixth sub data lines 4260 is connected with each sixth light emitting unit column 110-14.

For example, as illustrated by FIGS. 1-6, one column of first sub-pixel circuits 031 connected with the fifth light emitting unit column 110-13 and one column of second sub-pixel circuits 032 connected with the fourth light emitting unit column 120-12 are located in the same column, one column of first sub-pixel circuits 031 connected with the sixth light emitting unit column 110-14 and another column of second sub-pixel circuits 032 connected with the fourth light emitting unit column 120-12 are located in the same column; an interval is arranged between the fourth sub data line 4240 and the sixth sub data line 4260 or between the fourth sub data line 4240 and the fifth sub data line 4250. FIG. 5D schematically shows that the pixel circuit connected with the sixth sub data line 4260 and the pixel circuit connected with the fourth sub data line 4240 are located in the same column, so there is an interval between the sixth sub data line 4260 and the fourth sub data line 4240, but it is not limited thereto. The pixel circuit connected with the fourth sub data line and the pixel circuit connected with the fifth sub data line are located in the same column, and there is an interval between the fourth sub data line and the fifth sub data line. Here, the fifth sub data line 4250 only refers to the data line, connected with the pixel circuit in the first display region, among the third data line 423 in the above embodiment, and the sixth sub data line 4260 refers to the data line, connected with the pixel circuit in the first display region, among the fourth data line 424 in the above embodiment.

Figure 5E:
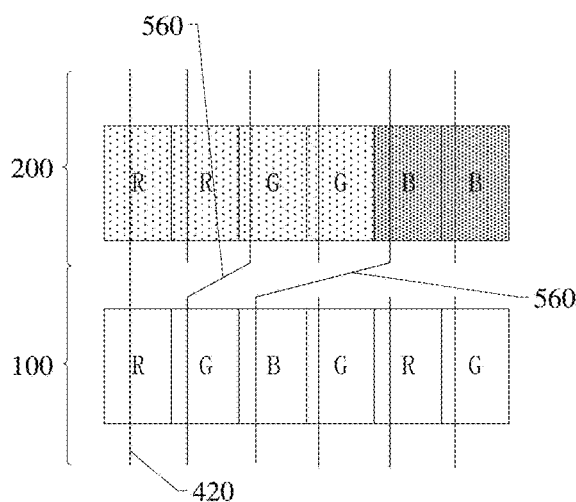
FIG. 5E is a partial plan view of a first display region and a second display region in a display substrate according to another example of an embodiment of the present disclosure.

For example, FIG. 5E is a partial plan view of a first display region and a second display region in a display substrate according to another example of an embodiment of the present disclosure. The difference between the example shown in FIG. 5E and the example shown in FIG. 5D lies in the arrangement of pixels. In the example shown in FIG. 5D, the pixels are arranged in GGRB, and in the example shown in FIG. 5E, the pixels are arranged in real RGB. As illustrated by FIG. 5E, every six RGB light emitting units located in the first display region 100 are one repetition period. The data line 420 connected with the first column of R light emitting units of the first display region 100 and the data line 420 connected with the first column of R light emitting units of the second display region 100 are the same continuous data line; there is an interval between the data line 420 connected with the light emitting units in the second column of G light emitting units of the first display region 100 and the data line 420 connected with the second column of R light emitting units of the second display region 200, and the data line 420 connected with the light emitting units in the second column of G light emitting units of the first display region 100 and the data line 420 connected with the third column of G light emitting units (or the fourth column of G light emitting units) of the second display region 200 are connected by the data line connection portion 560. There is an interval between the data line 420 connected with the third column of B light emitting units of the first display region 100 and the data line 420 connected with the third column of G light emitting units of the second display region 200, and the data line 420 connected with the third column of B light emitting units of the first display region 100 and the data line 420 connected with the fifth column of B light emitting units (or sixth column of B light emitting units) of the second display region 200 are connected by the data line connection portion 560. There is an interval between the data line 420 connected with the fourth column of G light emitting units of the first display region 100 and the data line 420 connected with the fourth column of G light emitting units of the second display region 200. There is an interval between that data line 420 connected with the light emitting unit in the fifth column of R light emitting units of the first display region 100 and the data line 420 connected with the fifth column of B light emitting units of the second display region 200. There is an interval between the data line 420 connected with the sixth column of G light emitting unit of the first display region 100 and the data line 420 connected with the sixth column of B light emitting units of the second display region 100. The embodiment of the present disclosure is not limited to the above connection, as long as one R light emitting unit in the first display region and one R light emitting unit in the second display region are connected with the same data line, one B light emitting unit in the first display region and one B light emitting unit in the second display region are connected with the same data line, and one G light emitting unit in the first display region and one G light emitting unit in the second display region are connected with the same data line.

For example, as illustrated by FIGS. 1-6, the first display region 100 includes a plurality of first sub light emitting unit groups 1-1 and a plurality of second sub light emitting unit groups 1-2 alternately arranged in the first direction and the second direction. The first sub light emitting unit group 1-1 includes light emitting units in the first light emitting unit column 110-11 and the second light emitting unit column 110-12; the second sub light emitting unit group 1-2 includes light emitting units in the fifth light emitting unit column 110-13 and the sixth light emitting unit column 110-14. The second display region 200 includes a plurality of sub light emitting unit group 1-3.

For example, as illustrated by FIGS. 1-6, each sub light emitting unit group includes one first color light emitting unit R, one second color light emitting unit pair G1 and G2, and one third color light emitting unit B. The first color light emitting unit R and the third color light emitting unit B are arranged in the second direction, and the second color light emitting unit pair G1 and G2 includes two second color light emitting units arranged in the second direction. The first color light emitting unit R and the second color light emitting unit pair G1 and G2 are arranged along the first direction, and the arrangement direction of the first color light emitting unit R and the third color light emitting unit B in the first sub light emitting unit group 1-1 is opposite to that of the first color light emitting unit R and the third color light emitting unit B in the second sub light emitting unit group 1-2, and the relative position distribution of light emitting units in the first sub light emitting unit group 1-1 is the same as that in the third sub light emitting unit group 1-3. The embodiment of the present disclosure takes the first color light emitting unit as a red light emitting unit, the second color light emitting unit pair as a green light emitting unit pair and the third color light emitting unit as a blue light emitting unit as an example, but it is not limited thereto. For example, the first color light emitting unit may be a blue light emitting unit, the second color light emitting unit pair may be a green light emitting unit pair, and the third color light emitting unit may be a red light emitting unit. For example, the first color light emitting unit is a green light emitting unit, the second color light emitting unit pair is a red light emitting unit pair, and the third color light emitting unit is a blue light emitting unit.

For example, as illustrated by FIGS. 1-6, the base substrate further includes a third display region 300, the second display region 200 further includes a plurality of third sub-pixel circuits 033, the third display region 300 includes a plurality of third light emitting units 130-1, and the third light emitting units 130-1 include a seventh light emitting unit column 130-11 and an eighth light emitting unit column 130-12 which are adjacently arranged. The arrangement direction of the first light emitting unit column 110-11 and the second light emitting unit column 110-12 is the same as that of the seventh light emitting unit column 130-11 and the eighth light emitting unit column 130-12. Each light emitting unit column in the third display region 300 is connected with one column of second sub-pixel circuit pairs 033-1, each column of second sub-pixel circuit pairs 033-1 includes two adjacent columns of third sub-pixel circuits 033.

For example, as illustrated by FIGS. 1-6, the display substrate further includes a plurality of seventh sub data lines 4270 and a plurality of eighth sub data lines 4280 which extend in the second direction, each seventh sub data line 4270 is connected with each seventh light emitting unit column 130-11, and each eighth sub data line 4280 is connected with each eighth light emitting unit column 130-12.

For example, as illustrated by FIGS. 1-6, at least one of the seventh sub data line 4270 and the eighth sub data line 4280 is arranged between the third sub data line 4230 and the fourth sub data line 4240. Herein, the seventh sub data line 4270 only refers to the data line, connected with the pixel circuits in the second display region, among the second data line 422 in the above embodiments, and the eighth sub data line 4280 only refers to the data line, connected with the pixel circuits in the second display region, among the third data line 423 in the above embodiments.

For example, as illustrated by FIGS. 1-6, the seventh sub data line 4270 and the eighth sub data line 4280 are both arranged between the third sub data line 4230 and the fourth sub data line 4240, and an interval is provided between the eighth sub data line 4280 and the fifth sub data line 4250 to arrange the data line connection portion 560.

For example, there is a break between the eighth sub data line 4280 and the fifth sub data line 4250 at the interval between the pixel circuit of the first display region and the pixel circuit of the second display region, and the connection portion 560 is provided at the break.

For example, as illustrated by FIGS. 1-6, a plurality of third sub-pixel circuits 033 are configured to connected with a plurality of fourth sub light emitting unit groups 1-4, the relative position distribution of light emitting units in each fourth sub light emitting unit group 1-4 is the same as that of the light emitting units in the third sub light emitting unit group 1-3, the first sub-pixel circuit pairs 032-1 connected with the third sub light emitting unit group 1-3 and the second sub-pixel circuit pairs 033-1 connected with the fourth light emitting unit group 1-4 are alternately arranged along the first direction and the second direction.

For example, as illustrated by FIGS. 1-6, the third display region 300 includes a central region 301 and an edge region 302 surrounding the central region 301. The edge region 302 includes a plurality of dummy pixel circuits arranged along the first direction and the second direction to form a plurality of dummy pixel circuit columns 320-1 and a plurality of dummy pixel circuit rows 320-2.

For example, as illustrated by FIGS. 1-6, the plurality of dummy pixel circuit columns 320-1 in the third display region 300 include dummy pixel circuit column groups 3201 composed of four adjacent columns, and each dummy pixel circuit column group 3201 includes a first dummy pixel circuit column 0341, a second dummy pixel circuit column 0342, a third dummy pixel circuit column 0343, and a fourth dummy pixel circuit column 0343 which are sequentially arranged in the first direction.

For example, as illustrated by FIGS. 1-6, the display substrate further includes a first dummy data line 431, a second dummy data line 432, a third dummy data line 433, and a fourth dummy data line 434. The first dummy data line 431 is connected with the first dummy pixel circuit column 0341, the second dummy data line 432 is connected with the second dummy pixel circuit column 0342, the third dummy data line 433 is connected with the third dummy pixel circuit column 0343, and the fourth dummy data line 433 is connected with the fourth dummy pixel circuit column 0344.

For example, as illustrated by FIGS. 1-6, one column of first sub-pixel circuits 031 connected with the first light emitting unit column 110-11 and the first dummy pixel circuit column 0341 are located in the same column. One column of first sub-pixel circuits 031 connected with the second light emitting unit column 110-12 and the second dummy pixel circuit column 0342 are located in the same column. One column of first sub-pixel circuits 031 connected with the fifth light emitting unit column 110-13 and the third dummy pixel circuit column 0343 are located in the same column. One column of first sub-pixel circuits 031 connected with the sixth light emitting unit column 110-14 and the fourth dummy pixel circuit column 0344 are located in the same column. Two data lines connected with the first light emitting unit group 1-1 and the corresponding two dummy data lines are two continuous data lines, or two data lines connected with the second light emitting unit group 1-2 and the corresponding two dummy data lines are two continuous data lines. FIG. 6 schematically shows that the two data lines connected with the first light emitting unit group 1-1 and the corresponding two dummy data lines are continuous data lines.

For example, as illustrated by FIGS. 1-6, the display substrate further includes a peripheral region 400 located at a side of the third display region 300 away from the first display region 100, and two dummy data lines connected with the first light emitting unit group 1-1 or the second light emitting unit group 1-2 bypass the central region 301 to connect the seventh sub data line 4270 and the eighth sub data line 4280 in the peripheral region 400, respectively.

For example, as illustrated by FIGS. 1-6, the first dummy data line 431 and the first sub data line 4210 are one continuous data line, the second dummy data line 432 and the second sub data line 4220 are one continuous data line, an interval is provided between the third dummy data line 433 and the fifth sub data line 4250, and an interval is provided between the fourth dummy data line 434 and the sixth sub data line 4260.

For example, as illustrated by FIGS. 1-6, the first dummy data line 431 bypasses the central region 301 to connect the seventh sub data line 4270 in the peripheral region 400, and the second dummy data line bypasses the central region to connect the eighth data line in the peripheral region.

Figure 7:
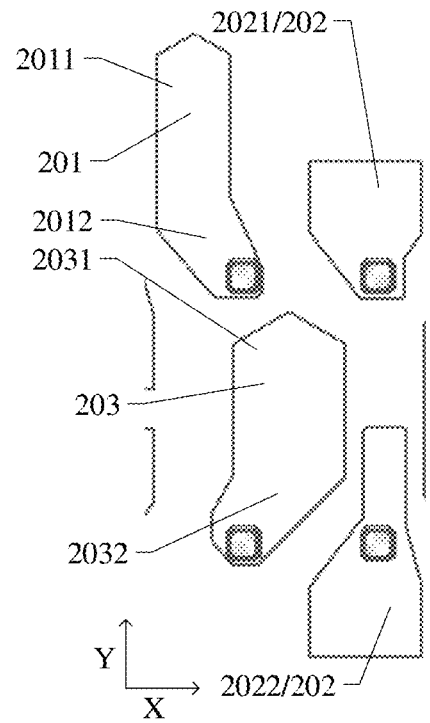
FIG. 7 is a schematic diagram of a second electrode of a light emitting unit group located in a first display region according to an embodiment of the present disclosure.
Figure 8:
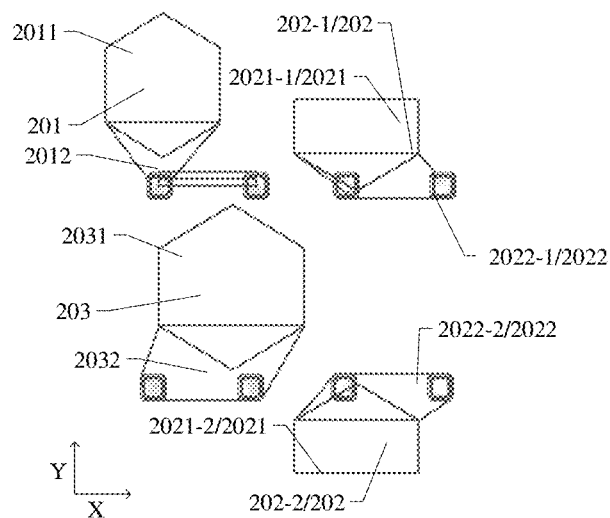
FIG. 8 is a schematic diagram of a second electrode of a light emitting unit group located at a non-edge region of a second display region according to an embodiment of the present disclosure.
Figure 9:
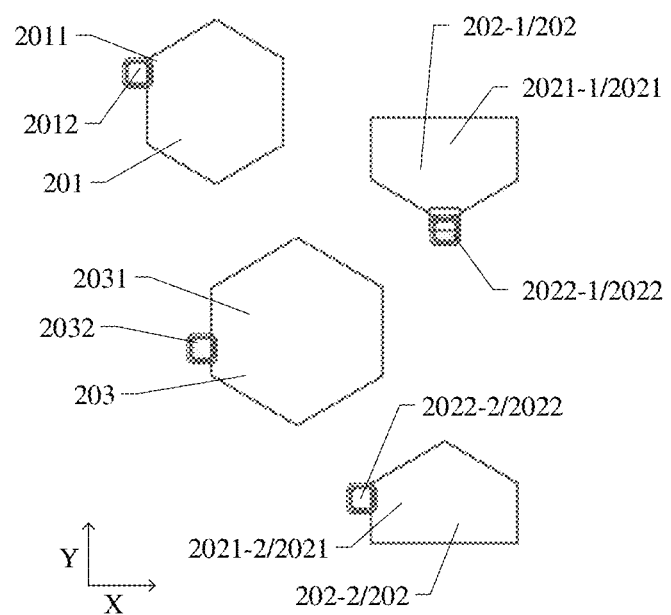
FIG. 9 is a schematic diagram of a second electrode of a light emitting unit group located in a third display region according to an embodiment of the present disclosure.

For example, FIG. 7 is a schematic diagram of a second electrode of a light emitting unit group located in a first display region according to an embodiment of the present disclosure; FIG. 8 is a schematic diagram of a second electrode of a light emitting unit group located at a non-edge region of a second display region according to an embodiment of the present disclosure;

FIG. 9 is a schematic diagram of a second electrode of a light emitting unit group located in a third display region according to an embodiment of the present disclosure. As illustrated by FIGS. 1 to 9, the second electrode 22 of each light emitting unit 20 includes a main body electrode 22-1 and a connection electrode 22-2, the shape of the main body electrode 22-1 is basically the same as that of the effective light emitting region of each light emitting unit 20, the connection electrode 22-2 is configured to be electrically connected with the second electrode of the first light emitting control transistor T6 of the pixel circuit through a fifth connection portion 550. Each light emitting unit group located in the display region includes a plurality of light emitting units of different colors. For example, each light emitting unit group includes a first color light emitting unit 201, a second color light emitting unit pair 202, and a third color light emitting unit 203.

For example, as illustrated by FIGS. 1 to 9, the area of the main body electrode 22-1 of one color light emitting unit located in at least one of the third display region 300 and the non-edge region of the second display region 200 is greater than that of the main body electrode 22-1 of the light emitting unit 20 located in the first display region 100 and having the same color as the above-mentioned one color light emitting unit. The area of the main body electrode of each color light emitting unit is related to the area of its effective light emitting region. In the embodiment of the present disclosure, by setting the area of the main body electrode of one color light emitting unit located in at least one of the third display region and the non-edge region of the second display region to be greater than the area of the main body electrode of the light emitting unit located in the first display region and having the same color as the above-mentioned one color light emitting unit, the area of the effective light emitting region of one color light emitting unit located in at least one of the third display region and the non-edge region of the second display region can be designed to be greater than that of the light emitting unit located in the first display region and having the same color as the above-mentioned one color light emitting unit.

In the embodiment of the present disclosure, because the densities of the light emitting unit groups of the second display region and the third display region are both smaller than those of the light emitting unit groups of the first display region, by setting the area of the main body electrode in the light emitting unit of at least one of the third display region and the non-edge region of the second display region to be greater than that of the main body electrode in the light emitting unit of the first display region, the area of the effective light emitting region of one color light emitting unit located in at least one of the third display region and the non-edge region of the second display region is designed to be greater than that of the light emitting unit located in the first display region and having the same color as the above-mentioned one color light emitting unit, the brightness of at least one of the second display region and the third display region can be increased on the basis of ensuring the service life of the luminescent material of the luminescent unit, and a more uniform full screen visual display effect can be realized.

For example, the embodiment of the present disclosure schematically shows that, in the third display region 300 and the non-edge region of the second display region 200, the area of the main body electrode 22-1 of one color light emitting unit is greater than that of the main body electrode 22-1 of the light emitting unit 20 located in the first display region 100 and having the same color as the above-mentioned one color light emitting unit, so that the area of the effective light emitting region of one color light emitting unit located in the third display region and the non-edge region of the second display region is designed to be greater than that of the light emitting unit located in the first display region and having the same color as the above-mentioned one color light emitting unit. Therefore, the brightness of the second display region and the third display region can be increased on the basis of ensuring the service life of the luminescent material of the luminescent unit, and a more uniform full screen visual display effect can be realized.

For example, in an example of the embodiment of the present disclosure, each light emitting unit in the first display region, the second display region and the third display region is connected with one pixel circuit, that is, each light emitting unit in the second display region and the third display region may not be connected with a pixel circuit pair, but only connected with one pixel circuit. In this case, the densities of the light emitting unit groups of the second display region and the third display region are both smaller than those of the light emitting unit group of the first display region. By setting the area of the main body electrode in the light emitting unit of at least one of the second display region and the third display region to be greater than that of the light emitting unit of the first display region, so that the area of the effective light emitting region of one color light emitting unit located in at least one of the third display region and the non-edge region of the second display region is designed to be greater than that of the light emitting unit located in the first display region and having the same color as the above-mentioned one color light emitting unit, the display effect of each display region can be as uniform as possible.

For example, in another example of the embodiment of the present disclosure, each pixel circuit group includes a plurality of pixel circuits, and at least one of the second pixel circuit group and the third pixel circuit group in the second display region includes a plurality of pixel circuit pairs, and two pixel circuits included in each pixel circuit pair are configured to be electrically connected with the second electrode of the same light emitting unit. For example, the second pixel circuit group and the third pixel circuit group in the second display region each includes a plurality of pixel circuit pairs, each pixel circuit pair in the second pixel circuit group is connected with each light emitting unit in the second light emitting unit group, and each pixel circuit pair in the third pixel circuit group is connected with each light emitting unit in the third light emitting unit group. The density of light emitting unit groups in the second display region and the density of light emitting unit groups in the third display region both are smaller than that in the first display region. Combining the technical solution of designing pixel circuits connected with the light emitting units in the second display region and the third display region as pixel circuit pairs with the technical solution of setting the area of the main body electrode in the light emitting units in the second display region and the third display region to be greater than that of the main body electrode in the light emitting unit in the first display region, on the basis of ensuring the life of the light emitting materials of the light emitting units, the current and brightness of the light emitting units in the second display region and the third display region are increased to 1.8 to 2 times that in the case of driving by one pixel circuit, which solves the problem of low current and brightness in the second display region and the third display region, and realizes a more uniform visual display effect of a full screen.

For example, as illustrated by FIGS. 1 to 9, each light emitting unit group includes a first color light emitting unit 201, and an area ratio of the main body electrode 2011 of each first color light emitting unit 201 located in at least one of the non-edge region of the second display region 200 and the third display region 300 to the main body electrode 2011 of each first color light emitting unit 201 located in the first display region 100 is 1.5 to 2.5. For example, each light emitting unit group includes a first color light emitting unit 201, and the area ratio of the main body electrode 2011 of each first color light emitting unit 201 located in at least one of the non-edge region of the second display region 200 and the third display region 300 to the main body electrode 2011 of each first color light emitting unit 201 located in the first display region 100 is 1.9 to 2.1.

For example, the area ratio of the effective light emitting region of each first color light emitting unit 201 located in at least one of the non-edge region of the second display region 200 and the third display region 300 to the effective light emitting region of each first color light emitting unit 201 located in the first display region 100 is 2.

For example, as illustrated by FIGS. 1 to 9, the main body electrode 2011 and the effective light emitting region of the first color light emitting unit 201 located in each display region all have a shape of hexagonal, and the area of the connection electrode 2012 of the first color light emitting unit 201 located at the non-edge region of the second display region 200 may be greater than that of the connection electrode 2012 of the first color light emitting unit 201 located in the first display region 100 to realize the connection with the pixel circuit pair.

For example, as illustrated by FIGS. 1 to 9, the area ratio of the main body electrode 2021 of each second color light emitting unit pair 202 located in at least one of the third display region 300 and the non-edge region of the second display region 200 to the main body electrode 2021 of each second color light emitting unit pair 202 located in the first display region 100 is 1.5 to 2.5. For example, the area ratio of the main body electrode 2021 of each second color light emitting unit pair 202 located in at least one of the third display region 300 and the non-edge region of the second display region 200 to the main body electrode 2021 of each second color light emitting unit pair 202 located in the first display region 100 is 1.9 to 2.1.

For example, the area ratio of the effective light emitting region of each second color light emitting unit pair 202 located in the non-edge region of the second display region 200 and the third display region 300 to the effective light emitting region of each second color light emitting unit pair 202 located in the first display region 100 is 2.

For example, as illustrated by FIGS. 1 to 9, the area ratio of the main body electrode 2021-1 of each first light emitting unit block 202-1 located in at least one of the non-edge region of the second display region 200 and the third display region 300 to the main body electrode 2021-1 of each first light emitting unit block 202-1 located in the first display region 100 is 1.5 to 2.5. For example, the area ratio of the main body electrode 2021-2 of each second light emitting unit block 202-2 located in at least one of the non-edge region of the second display region 200 and the third display region 300 to the main body electrode 2021-2 of each second light emitting unit block 202-2 located in the first display region 100 is 1.5 to 2.5. For example, the area ratio of the main body electrode 2021-1 of each first light emitting unit block 202-1 located in at least one of the non-edge region of the second display region 200 and the third display region 300 to the main body electrode 2021-1 of each first light emitting unit block 202-1 located in the first display region 100 is 1.9 to 2.1. For example, the area ratio of the main body electrode 2021-2 of each second light emitting unit block 202-2 located in at least one of the non-edge region of the second display region 200 and the third display region 300 to the main body electrode 2021-2 of each second light emitting unit block 202-2 located in the first display region 100 is 1.9 to 2.1.

For example, the area of the connection electrode 2022-1 of each first light emitting unit block 202-1 located in the non-edge region of the second display region 200 is greater than that of the connection electrode 2022-1 of each first light emitting unit block 202-1 located in the first display region 100. For example, the area of the connection electrode 2022-2 of each second light emitting unit block 202-2 located in the non-edge region of the second display region 200 is greater than that of the connection electrode 2022-2 of each second light emitting unit block 202-2 located in the first display region 100 to facilitate the connection with the pixel circuit pair.

For example, the area ratio of the main body electrode 2031 of each third color light emitting unit 203 located in at least one of the non-edge region of the second display region 200 and the third display region 300 to the main body electrode 2031 of each third color light emitting unit 203 located in the first display region 100 is 1.5 to 2.5. For example, the area ratio of the main body electrode 2031 of each third color light emitting unit 203 located in at least one of the non-edge region of the second display region 200 and the third display region 300 to the main body electrode 2031 of each third color light emitting unit 203 located in the first display region 100 is 1.9 to 2.1.

For example, the area ratio of the main body electrode 2031 of each third color light emitting unit 203 located in the non-edge region of the second display region 200 and the third display region 300 to the main body electrode 2031 of each third color light emitting unit 203 located in the first display region 100 is 2. For example, the area ratio of the effective light emitting regions of the third color light emitting units 203 located in the non-edge regions of the second display region 200 and the third display region 300 to the effective light emitting regions of the third color light emitting units 203 located in the first display region 100 is 2.

For example, the area of the connection electrode 2032 of each third color light emitting unit 203 located in the non-edge region of the second display region 200 is greater than that of the connection electrode 2032 of each third color light emitting unit 203 located in the first display region 100 to realize the connection with the pixel circuit pair.

For example, the main body electrode and the effective light emitting region of the third color light emitting unit of each display region both have a shape of hexagonal.

For example, as illustrated by FIGS. 8 and 9, the second electrode of the light emitting unit group in the second display region is directly connected with the pixel circuit pair, the area of the connection electrode of the light emitting unit in the second display region is large, while the second electrode of the light emitting unit of the light emitting unit group in the third display region is connected with the pixel circuit pair in the second display region through the transparent line, and the area of the connection electrode of the light emitting unit in the third display region can be set to be small.

Figure 10:
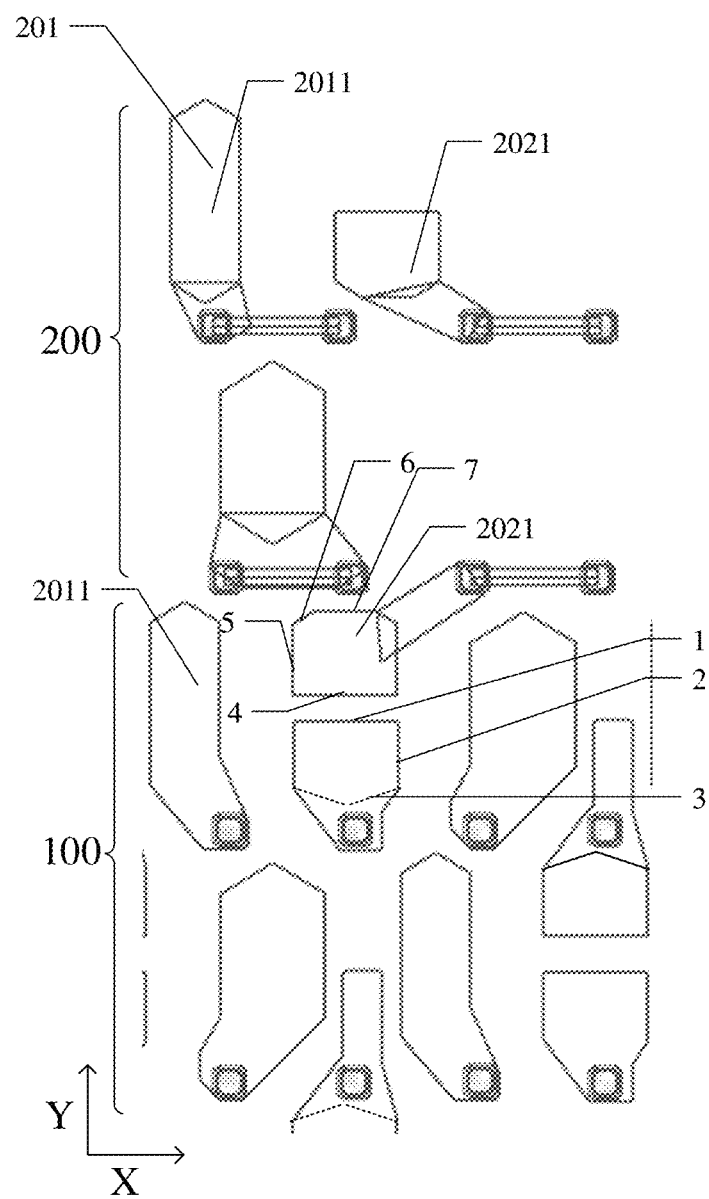
FIG. 10 is a schematic diagram of second electrodes of light emitting units in two rows of light emitting unit groups in the second display region bordering the first display region according to an embodiment of the present disclosure.

For example, FIG. 10 is a schematic diagram of second electrodes of light emitting units in two rows of light emitting unit groups in the second display region bordering the first display region according to an embodiment of the present disclosure. As illustrated by FIGS. 1 to 10, the main body electrode 2011 of each first color light emitting unit 201 in one row of light emitting unit groups adjacent to the first display region 100 in the Y direction of the second display region 200 have approximately the same shape and the same area as the main body electrode 2011 of each first color light emitting unit 201 located in the first display region 100. According to the embodiment of the present disclosure, the shapes and areas of the main body electrodes of the first color light emitting units in two rows of light emitting unit groups, adjacent to each other in the Y direction, respectively in the first display region and the second display region are all set to be approximately the same, that is, the areas of the main body electrodes of the first color light emitting units located at the edge of the second display region are designed to be different from those of the main body electrodes of the first color light emitting units located at the non-edge regions of the second display region, so that the brightness of most of the first color light emitting units in the second display region can be increased to uniform the overall screen display effect, and the problem that the main body electrodes of two rows of light emitting units conflict in space can be prevented.

For example, as illustrated by FIGS. 1 to 10, the area ratio of the main body electrode 2021 of each second color light emitting unit pair 202 in a row of light emitting unit groups adjacent to the first display region 100 in the second display region 200 to the main body electrode 2021 of each second color light emitting unit pair 202 located in the first display region 100 is 0.9 to 1.1. According to the embodiment of the present disclosure, the areas of the main body electrodes of the second color light emitting units in two rows of light emitting unit groups, adjacent to each other in the Y direction, respectively in the first display region and the second display region are set to be approximately the same, that is, the areas of the main body electrodes of the second color light emitting units located at the edge of the second display region are designed to be different from those of the main body electrodes of the second color light emitting units located at the non-edge region of the second display region, so that the brightness of most of the second color light emitting units in the second display region can be increased to uniformly display the whole screen effect, and the problem that the main body electrodes of two rows of light emitting units conflict in space can be prevented.

For example, as illustrated by FIGS. 1 to 10, the shapes of the main body electrodes 2021 of the two second color sub-pixels included in the second color sub-pixel pair 202 in the first display region 100 are different from the shapes of the two main body electrodes 2021 of each second color light emitting unit pair 202 of a row of light emitting unit groups, adjacent to the first display region 100, in the second display region 200.

In the embodiment of the present disclosure, the size of the gap (PDL gap) of the pixel definition layer between two adjacent light emitting units in the non-edge region of the second display region is approximately the same as that of the PDL gap between two adjacent light emitting units in the edge region of the second display region, so that the second display region displays the uniformity of image light.

For example, as illustrated by FIGS. 1 to 10, the main body electrodes 2021 of the two second color sub-pixels included in the second color sub-pixel pair 202 in the first display region 100 all have a shape of pentagon, and each pentagon includes one first edge 1 extending in the X direction, two second edges 2 extending in the Y direction, and two third edges 3 connected with the two second edges 2. The two third edges 3 intersect to form a sharp corner, and two sharp corners of the main body electrodes 2021 of the two second color sub-pixels are adjacent to each other. Each main body electrode 2021 of each second color light emitting unit pair 202 in a row of light emitting unit groups adjacent to the first display region 100 in the Y direction of the second display region 200 includes one fourth edge 4 extending in the X direction, two fifth edges 5 extending in the Y direction, two sixth edges 6 connected with the two fifth edges 5 and one seventh edge 7 connecting the two sixth edges 6, and the two seventh edges 7 of the main body electrodes 2021 of two second color sub-pixels are adjacent to each other.

For example, as illustrated by FIGS. 7 to 10, a length of the second edge 2 of the main body electrode 2021 of the second color light emitting unit in the first display region 100 is shorter than the length of the fifth edge 5 of the main body electrode 2021 of the second color light emitting unit at the edge of the second display region 200 to ensure that the area of the main body electrode of the second color light emitting unit in the first display region is approximately equal to that of the main body electrode of the second color light emitting unit at the edge of the second display region.

For example, as illustrated by FIGS. 7 to 10, upon the area of the main body electrode 2021 of the second color light emitting unit at the edge of the second display region 200 being set to be the same as that of the main body electrode 2021 of the second color light emitting unit of the first display region 100, in order to ensure the PDL gap between the second color light emitting unit and the first color light emitting unit (or the third color light emitting unit) at the edge of the second display region 200 and the PDL gap between the second color light emitting unit and the first color light emitting unit (or the third color light emitting unit) at the non-edge region of the second display region 200, a center connection line of two main body electrodes of each second color light emitting unit pair in a row of light emitting unit groups, adjacent to the first display region 100 in the first direction, of the second display region 200 is not parallel to a center connection line of the two main body electrodes of each second color light emitting unit part in the first display region.

Upon the area of the main body electrode 2021 of the second color light emitting unit at the edge of the second display region 200 being set to be the same as that of the main body electrode 2021 of the second color light emitting unit of the first display region 100, in order to ensure the PDL gap between the second color light emitting unit and the first color light emitting unit (or the third color light emitting unit) at the edge of the second display region 200 and the PDL gap between the second color light emitting unit and the first color light emitting unit (or the third color light emitting unit) at the non-edge of the second display region 200, if the main body electrode of the second color light emitting unit located at the edge of the second display region 200 has a shape of pentagon with a sharp corner, it will conflict with the connection electrode of the first color light emitting unit (or the third color light emitting unit) in space. Therefore, the shape of the main body electrode of the second color light emitting unit at the edge of the second display region no longer includes the sharp corner. In this case, in order to ensure that the area of the main body electrode of the second color light emitting unit at the edge of the second display region is roughly the same as that of the main body electrode of the second color light emitting unit at the first display region, it is needed to compensate the shape of the main body electrode of the second color light emitting unit at the edge of the second display region, that is, to add two sixth edges 6 and a seventh edge 7 connecting the two sixth edges 6, so that the area of the main electrode of the second color light-emitting unit at the edge of the second display region is equal to that of the second color light-emitting unit of the first display region under the condition that there is no conflict in space.

For example, as illustrated by FIGS. 1 to 10, the shape and area of the main body electrode 2031 of each third color light emitting unit 203 in a row of light emitting unit groups, adjacent to the first display region 100 in the Y direction, in the second display region 200 are almost the same as those of the main body electrode 2031 of each third color light emitting unit 203 located in the first display region 100. According to the embodiment of the present disclosure, the shapes and areas of the main body electrodes of the third color light emitting units in two rows of light emitting unit groups, adjacent to each other in the Y direction, respective in the first display region and the second display region are set to be approximately the same, that is, the areas of the main body electrodes of the third color light emitting units located at the edge of the second display region are designed to be different from those of the main body electrodes of the third color light emitting units located at the non-edge regions of the second display region, so that the brightness of most of the third color light emitting units in the second display region can be increased to uniform the overall screen display effect, and the spatial conflict between the main body electrodes of two rows of light emitting units can be prevented.

Figure 11:
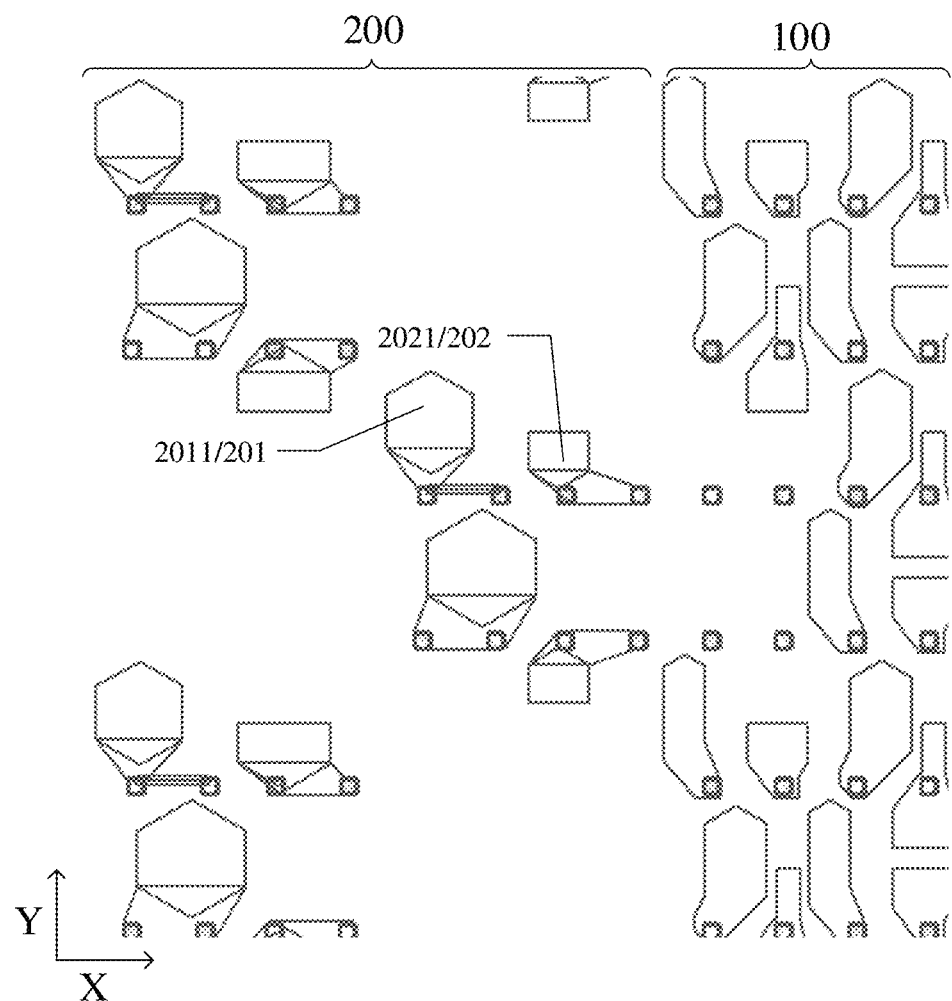
FIG. 11 is a schematic diagram of second electrodes of light emitting units in two columns of light emitting unit groups in the second display region bordering the first display region according to an embodiment of the present disclosure.

For example, FIG. 11 is a schematic diagram of the second electrode of each light emitting unit in two columns of light emitting unit groups in the second display region according to the embodiment of the present disclosure, which borders the first display region. As illustrated by FIG. 11, in a column of light emitting unit groups adjacent to the first display region 100 in the X direction of the second display region 200, the second color light emitting unit pair 202 is located at a side of the first color light emitting unit 201 and the third color light emitting unit 203 close to the first display region 100, and the area and shape of the main body electrode 2021 of each second color light emitting unit pair 202 in this column of light emitting unit groups are the same as those of each second color light emitting unit pair 202 located in the first display region 100. According to the embodiment of the present disclosure, the shapes and areas of the main body electrodes of the second color light emitting unit pairs, in two columns of light emitting unit groups adjacent to each other in the X direction, respectively in the first display region and the second display region are set to be approximately the same, that is, the areas of the main body electrodes of the second color light emitting unit pairs located at the edge of the second display region are designed to be different from those of the main body electrodes of the second color light emitting unit pairs located at the non-edge regions of the second display region, so that the brightness of most of the second color light emitting unit pairs in the second display region can be increased to uniformly display the whole screen effect, and the spatial conflict between the main body electrodes of two columns of light emitting units can be prevented at the same time.

For example, a third pixel circuit group is arranged between two adjacent second light emitting unit groups arranged in the Y direction, so that no light emitting unit group is arranged at the interval between two adjacent second light emitting unit groups arranged in the Y direction. The first display region 100 is provided with an interval between two adjacent first light emitting unit groups in a column of first light emitting unit groups close to the second display region 200 in the X direction. The interval region includes a first pixel circuit group that is not connected with the light emitting unit groups, and along the X direction, the first pixel circuit group and the light emitting unit group in a column of second light emitting unit groups adjacent to the first display region 100 are located on the same straight line, so that the first display region and the second display can be balanced in the X direction.

For example, as illustrated by FIG. 11, in a column of light emitting unit groups adjacent to the first display region 100 in the X direction of the second display region 200, the area ratio of the main body electrode 2011 of each first color light emitting unit 201 to the main body electrode 2011 of each first color light emitting unit 201 located in the first display region 100 is 1.5 to 2.5. For example, in a column of light emitting unit groups adjacent to the first display region 100 in the X direction of the second display region 200, the ratio of the effective light emitting region of each first color light emitting unit 201 to the effective light emitting region of each first color light emitting unit 201 located in the first display region 100 is 2. In the embodiment of the present disclosure, under the condition of ensuring that the main body electrodes of light emitting units in a column of light emitting unit groups, adjacent to the first display region in the X direction, in the second display region do not conflict in space, the shape and area of the main body electrodes of the first color light emitting units located at the edge of the second display region are roughly the same as those of the first color light emitting units located at the non-edge region of the second display region, so that the brightness of most of the first color light emitting units in the second display region can be increased to uniformly display the whole screen effect, and the spatial conflict between the main body electrodes of two rows of light emitting units can be prevented at the same time.

For example, as illustrated by FIG. 11, in a column of light emitting unit groups adjacent to the first display region 100 in the X direction of the second display region 200, the area ratio of the main body electrode 2031 of each third color light emitting unit 203 to the main body electrode 2031 of each third color light emitting unit 203 located in the first display region 100 is 1.5 to 2.5. For example, in a column of light emitting unit groups adjacent to the first display region 100 in the X direction of the second display region 200, the area ratio of the main body electrode 2031 of each third color light emitting unit 203 to the main body electrode 2031 of each third color light emitting unit 203 located in the first display region 100 is 1.9 to 2.1.

For example, in a column of light emitting unit groups adjacent to the first display region 100 in the X direction of the second display region 200, the area ratio of the effective light emitting region of each third color light emitting unit 203 to the effective light emitting region of each third color light emitting unit 203 located in the first display region 100 is 2. In the embodiment of the present disclosure, under the condition of ensuring that the main body electrodes of light emitting units in a column of light emitting unit groups adjacent to the first display region in the X direction in the second display region do not collide in space, the shape and area of the main body electrodes of the third color light emitting units located at the edge of the second display region are roughly the same as those of the third color light emitting units located at the non-edge region of the second display region, so that the brightness of most third color light emitting units in the second display region can be increased to uniformly display the whole screen effect, and the spatial conflict between the main body electrodes of two columns of light emitting units can be prevented at the same time.

Another embodiment of the present disclosure provides a display device including any of the above display substrates.

In the display device provided by an example of the embodiment of the present disclosure, two pixel circuits in the second display region drive one light emitting unit to emit light, which can increase the current and brightness of the light emitting unit of at least one of the second display region and the third display region, and realize a more uniform visual display effect of a full screen.

In a display device provided by an example of the embodiment of the present disclosure, by setting the area of the main body electrode in the light emitting unit of at least one of the second display region and the third display region to be greater than that of the main body electrode in the light emitting unit of the first display region, the area of the effective light emitting region of one color light emitting unit located in at least one of the third display region and the non-edge region of the second display region is designed to be greater than that of the light emitting unit located in the first display region and having the same color as the above-mentioned one color light emitting unit, the brightness of at least one of the second display region and the third display region can be increased on the basis of ensuring the service life of the luminescent material of the light emitting unit, and a more uniform full screen visual display effect can be realized.

In the display device provided by an example of the embodiment of the present disclosure, the unified algorithm processing of the integrated circuit (IC) in the first display region and the second display region can be satisfied by designing the data line at the junction of the first display region and the second display region, and the junction of the first display region and the third display region.

The following points need to be explained:

(1) In the drawings of the embodiments of the present disclosure, only the structures related to the embodiments of the present disclosure are involved, and other structures can refer to the general design.

(2) The features of the same embodiment and different embodiments of the present disclosure can be combined with each other without conflict.

The above is only an exemplary embodiment of the present disclosure, and it is not intended to limit the scope of protection of the present disclosure, which is determined by the appended claims.

The invention claimed is:

1. A display substrate, comprising:
a base substrate, comprising a first display region, a second display region and a third display region, wherein the first display region comprises a plurality of first light emitting unit groups and a plurality of first pixel circuit groups respectively connected with the plurality of first light emitting unit groups, the second display region comprises a plurality of second light emitting unit groups, a plurality of second pixel circuit groups and a plurality of third pixel circuit groups, the plurality of second light emitting unit groups are respectively connected with the plurality of second pixel circuit groups, the third display region comprises a plurality of third light emitting unit groups, which are respectively connected with the plurality of third pixel circuit groups, and a density of the plurality of second light emitting unit groups and a density of the plurality of third light emitting unit groups are both smaller than a density of the plurality of first light emitting unit groups, each light emitting unit group comprises a plurality of light emitting units, and each of the light emitting units comprises a first electrode, a light emitting layer, and a second electrode which are sequentially arranged along a direction perpendicular to the base substrate, and the second electrode is on a side of the light emitting layer facing the base substrate,
wherein the second electrode of each of the light emitting units comprises a main body electrode and a connection electrode, the connection electrode is configured to connect a pixel circuit, and each light emitting unit group located in display regions comprises a plurality of light emitting units of different colors;
among the light emitting units of a same color, an area of the main body electrode of at least one light emitting unit located in the third display region is greater than an area of at least one main body electrode located in the first display region.

2. The display substrate according to claim 1, wherein an area of an effective light emitting region of a light emitting unit of one color located in at least one of the third display region and the non-edge region of the second display region is greater than an area of a light emitting unit, with the same color as the light emitting unit of one color, located in the first display region.

3. The display substrate according to claim 1, wherein each pixel circuit group comprises a plurality of pixel circuits, and at least one of the second pixel circuit groups and the third pixel circuit groups comprises a plurality of pixel circuit pairs, and two pixel circuits included in each of the pixel circuit pairs are configured to be electrically connected with the second electrode of a same light emitting unit.

4. The display substrate according to claim 1, wherein each light emitting unit group comprises a first color light emitting unit, and an area ratio of the main body electrode of each first color light emitting unit located in at least one of the third display region and the non-edge region of the second display region to the main body electrode of each first color light emitting unit located in the first display region is in a range of 1.5 to 2.5.

5. The display substrate according to claim 4, wherein each light emitting unit group located in the display region further comprises a second color light emitting unit pair, the first color light emitting unit and the second color light emitting unit pair are arranged in a first direction, and two second color light emitting units included in the second color light emitting unit pair are arranged in a second direction, and the first direction and the second direction intersect with each other, an area ratio of the main body electrode of each second color light emitting unit pair located in at least one of the third display region and the non-edge region of the second display region to the main body electrode of each second color light emitting unit pair located in the first display region is in a range of 1.5 to 2.5.

6. The display substrate according to claim 5, wherein each light emitting unit group located in the display region further comprises a third color light emitting unit, the first color light emitting unit and the third color light emitting unit are arranged along the first direction, and an area ratio of the main body electrode of each third color light emitting unit located in at least one of the third display region and the non-edge region of the second display region to the main body electrode of each third color light emitting unit located in the first display region is in a range of 1.5 to 2.5.

7. The display substrate according to claim 6, wherein the main body electrode of each first color light emitting unit in a row of light emitting unit groups, adjacent to the first display region, in the second display region has substantially the same shape and the same area as each first color light emitting unit located in the first display region; the main body electrode of each second color light emitting unit pair in the row of light emitting unit groups, adjacent to the first display region, in the second display region has approximately the same area as the main body electrode of each second color light emitting unit pair located in the first display region; the main body electrode of each third color light emitting unit in the row of light emitting unit groups, adjacent to the first display region, in the second display region has substantially the same shape and the same area as each third color light emitting unit located in the first display region.

8. The display substrate according to claim 7, wherein shapes of main body electrodes of two second color sub-pixels included in the second color sub-pixel pair in the first display region are different from shapes of two main body electrodes of each second color light emitting unit pair of the light emitting unit group in the row, adjacent to the first display region, in the second display region.

9. The display substrate according to claim 8, wherein shapes of the main body electrodes of the two second color sub-pixels included in the second color sub-pixel pair of the first display region are both pentagons, and each of the pentagons comprises one first edge extending in the second direction, two second edges extending in the first direction, and two third edges connected with the two second edges, the two third edges intersect to form a sharp corner, and two sharp corners of the main body electrodes of the two second color sub-pixels are adjacent to each other, each main body electrode of each second color light emitting unit pair in the row of light emitting unit groups, adjacent to the first display region, in the second display region comprises one fourth edge extending in the second direction, two fifth edges extending in the first direction, two sixth edges connected with the two fifth edges and a seventh edge connecting the two sixth edges, and two seventh edges of the main body electrodes of the two second color sub-pixels are adjacent to each other.

10. The display substrate according to claim 9, wherein a length of the second edge is smaller than a length of the fifth edge.

11. The display substrate according to claim 7, wherein a central connection line of two main body electrodes of each second color light emitting unit pair in the row of light emitting unit groups, adjacent to the first display region, in the second display region is not parallel to a central connection line of two main body electrodes of each second color light emitting unit pair in the first display region.

12. The display substrate according to claim 6, wherein, in a column of light emitting unit groups, adjacent to the first display region, in the second display region, the second color light emitting unit pair is located at a side of the first color light emitting unit and the third color light emitting unit close to the first display region;

an area and a shape of the main body electrode of each second color light emitting unit pair in the column of light emitting unit groups, adjacent to the first display region, in the second display region are approximately the same as an area and a shape of the main body electrode of each second color light emitting unit pair located in the first display region.

13. The display substrate according to claim 12, wherein an area ratio of the main body electrode of each first color light emitting unit in the column of light emitting unit groups, adjacent to the first display region, in the second display region to the main body electrode of each first color light emitting unit located in the first display region is in a range of 1.5 to 2.5; an area ratio of the main body electrode of each third color light emitting unit in the column of light emitting unit groups, adjacent to the first display region, in the second display region to the main body electrode of each third color light emitting unit located in the first display region is in a range of 1.5-2.5.

14. The display substrate according to claim 1, wherein each pixel circuit group comprises a plurality of pixel circuits, the plurality of second pixel circuit groups comprise a plurality of first pixel circuit units, each first pixel circuit unit at least comprises a first pixel circuit and a second pixel circuit, and at least two pixel circuits in the first pixel circuit unit are configured to be electrically connected with the second electrode of a same light emitting unit, each of the plurality of pixel circuits comprises a data writing transistor, a driving transistor and a first reset transistor, a second electrode of the first reset transistor is connected with the second electrode of a corresponding light emitting unit, and a first electrode of the data writing transistor is connected with a second electrode of the driving transistor, the display substrate further comprises a plurality of first connection portions, a first end of each first connection portion of at least part of the first connection portions is connected with a second electrode of the data writing transistor of the first pixel circuit, and a second end of each first connection portion of the at least part of the first connection portions is connected with a second electrode of the data writing transistor of the second pixel circuit to connect at least two data writing transistors of the first pixel circuit unit with a same data line, at least portion of each first connection portion of the at least part of the first connection portions is located between the second electrode of the data writing transistor and the first electrode of the first reset transistor in the first pixel circuit.

15. The display substrate according to claim 14, wherein each of the pixel circuits further comprises a threshold compensation transistor, a first electrode of the threshold compensation transistor is connected with the first electrode of the driving transistor, a second electrode of the threshold compensation transistor is connected with a gate electrode of the driving transistor, and the first connection portion is located between the second electrode of the threshold compensation transistor and the first electrode of the first reset transistor in the first pixel circuit.

16. The display substrate according to claim 1, wherein the first display region comprises a plurality of first light emitting units and a plurality of first sub-pixel circuits; the plurality of first light emitting units comprise a first light emitting unit column and a second light emitting unit column which are arranged adjacently; each light emitting unit column is connected with a corresponding column of first sub-pixel circuits; the second display region comprises a plurality of second light emitting units and a plurality of second sub-pixel circuits; the plurality of second light emitting units comprise a third light emitting unit column and a fourth light emitting unit column which are arranged adjacently, and each light emitting unit column in the second display region is connected with a column of first sub-pixel circuit pairs, and each column of first sub-pixel circuit pairs comprise two adjacent columns of second sub-pixel circuits; and a plurality of first sub data lines, a plurality of second sub data lines, a plurality of third sub data lines and a plurality of fourth sub data lines on the base substrate, wherein each of the first sub data lines is connected with each first light emitting unit column, each of the second sub data lines is connected with each second light emitting unit column, each of the third sub data lines is connected with each third light emitting unit column, and each of the fourth sub data lines is connected with each fourth light emitting unit column;
  wherein an arrangement direction of the first light emitting unit column and the second light emitting unit column is the same as an arrangement direction of the third light emitting unit column and the fourth light emitting unit column;
  one column of first sub-pixel circuits connected with the first light emitting unit column and one column of second sub-pixel circuits connected with the third light emitting unit column are located in a same column, and one first sub data line and one third sub data line are one continuous data line extending in the second direction;
  two columns of second sub-pixel circuits connected with the fourth light emitting unit column and one column of first sub-pixel circuits connected with the second light emitting unit column are located in different columns, and the second sub data line and the fourth sub data line are connected by a data line connection portion, and an extending direction of the data line connection portion intersects with an extending direction of the first sub data lines.

17. The display substrate according to claim 1, wherein each light emitting unit group located in the display region further comprises a second color light emitting unit pair, the first color light emitting unit and the second color light emitting unit pair are arranged in a first direction, and two second color light emitting units included in the second color light emitting unit pair are arranged in a second direction, and the first direction and the second direction intersect with each other, an area ratio of the main body electrode of each second color light emitting unit pair located in at least one of the third display region and the non-edge region of the second display region to the main body electrode of each second color light emitting unit pair located in the first display region is in a range of 1.5 to 2.5.

18. The display substrate according to claim 1, wherein each light emitting unit group located in the display region further comprises a third color light emitting unit, the first color light emitting unit and the third color light emitting unit are arranged along the first direction, and an area ratio of the main body electrode of each third color light emitting unit located in at least one of the third display region and the non-edge region of the second display region to the main body electrode of each third color light emitting unit located in the first display region is in a range of 1.5 to 2.5.

19. The display substrate according to claim 1, wherein the main body electrode of each first color light emitting unit in a row of light emitting unit groups, adjacent to the first display region, in the second display region has substantially the same shape and the same area as each first color light emitting unit located in the first display region; the main body electrode of each second color light emitting unit pair in the row of light emitting unit groups, adjacent to the first display region, in the second display region has approximately the same area as the main body electrode of each second color light emitting unit pair located in the first display region; the main body electrode of each third color light emitting unit in the row of light emitting unit groups, adjacent to the first display region, in the second display region has substantially the same shape and the same area as each third color light emitting unit located in the first display region.

20. A display device, comprising the display substrate according to claim 1.

* * * * *